United States Patent
Yamaguchi et al.

(10) Patent No.: US 6,174,757 B1
(45) Date of Patent: *Jan. 16, 2001

(54) METHOD FOR PRODUCING SEMICONDUCTOR DEVICE

(75) Inventors: Naoaki Yamaguchi; Hongyong Zhang; Satoshi Teramoto; Hideto Ohnuma, all of Kanagawa (JP)

(73) Assignee: Semiconductor Energy Laboratory Co., Ltd., Kanagawa (JP)

( * ) Notice: Under 35 U.S.C. 154(b), the term of this patent shall be extended for 0 days.

This patent is subject to a terminal disclaimer.

(21) Appl. No.: 09/273,425

(22) Filed: Mar. 19, 1999

Related U.S. Application Data

(62) Division of application No. 08/757,292, filed on Nov. 27, 1996, now Pat. No. 5,897,346, which is a division of application No. 08/395,434, filed on Feb. 28, 1995, now Pat. No. 5,620,906.

(30) Foreign Application Priority Data

| Feb. 28, 1994 | (JP) | 6-054865 |
| Mar. 27, 1994 | (JP) | 6-080940 |
| Apr. 5, 1994 | (JP) | 6-092958 |
| Jun. 14, 1994 | (JP) | 6-156514 |

(51) Int. Cl.$^7$ .................................................. H01L 21/84

(52) U.S. Cl. ................................... 438/166; 438/517

(58) Field of Search .................................. 438/162, 166, 438/308, 513, 517, 528, 530, 535, 910

(56) References Cited

U.S. PATENT DOCUMENTS

| 3,849,204 | 11/1974 | Fowler | 437/937 |
| 4,151,008 | 4/1979 | Kirkpatrick | 437/942 |
| 4,566,913 | 1/1986 | Brodsky et al. . | |
| 4,613,382 | 9/1986 | Katayama et al. | 437/18 |
| 4,670,063 | 6/1987 | Schachameyer et al. . | |
| 4,762,801 | 8/1988 | Kapoor . | |
| 4,883,766 | 11/1989 | Ishida et al. | 437/40 TFT |
| 4,943,837 | 7/1990 | Konishi et al. | 437/937 |
| 5,171,710 | 12/1992 | Yamazaki et al. | 437/942 |
| 5,192,708 | 3/1993 | Beyer et al. . | |
| 5,219,786 | 6/1993 | Noguchi . | |
| 5,306,651 | * 4/1994 | Masumo et al. | 438/166 |
| 5,328,861 | 7/1994 | Miyakawa | 437/40 TFT |
| 5,372,958 | 12/1994 | Miyasaka et al. . | |
| 5,583,369 | 12/1996 | Yamazaki et al. . | |
| 5,681,759 | 10/1997 | Zhang . | |

FOREIGN PATENT DOCUMENTS 61-113771   5/1986 (JP) .

OTHER PUBLICATIONS

Matsuo et al., "Poly–Si TFTs with LDD Structure Fabricated at Low Temperature," Extended Abstracts of 1993 International Conference on Solid State Devices and Materials, Makuhari, 1993, pp. 437–439.

Wolf et al., "Silicon Processing For The VLSI Era", vol. 1: Process Technology, 1986, pp. 191–195, 316–320.

* cited by examiner

*Primary Examiner*—Chandra Chaudhari
(74) *Attorney, Agent, or Firm*—Nixon Peabody LLP; Jeffrey L. Costellia

(57) ABSTRACT

In producing a semiconductor device such as a thin film transistor (TFT), a silicon semiconductor film is formed on a substrate having an insulating surface, such as a glass substrate, and then a silicon nitride film is formed on the silicon semiconductor film. After that, a hydrogen ion, fluorine ion, or chlorine ion is introduced into the silicon semiconductor film through the silicon nitride film, and then the silicon semiconductor film into which an ion is introduced is heated in an atmosphere containing hydrogen, fluorine, chlorine or these mixture, to neutralize dangling bonds in the silicon semiconductor film and reduce levels in the silicon semiconductor film.

53 Claims, 19 Drawing Sheets

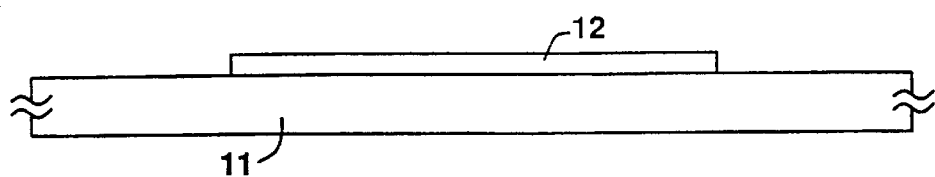
FIG.9A
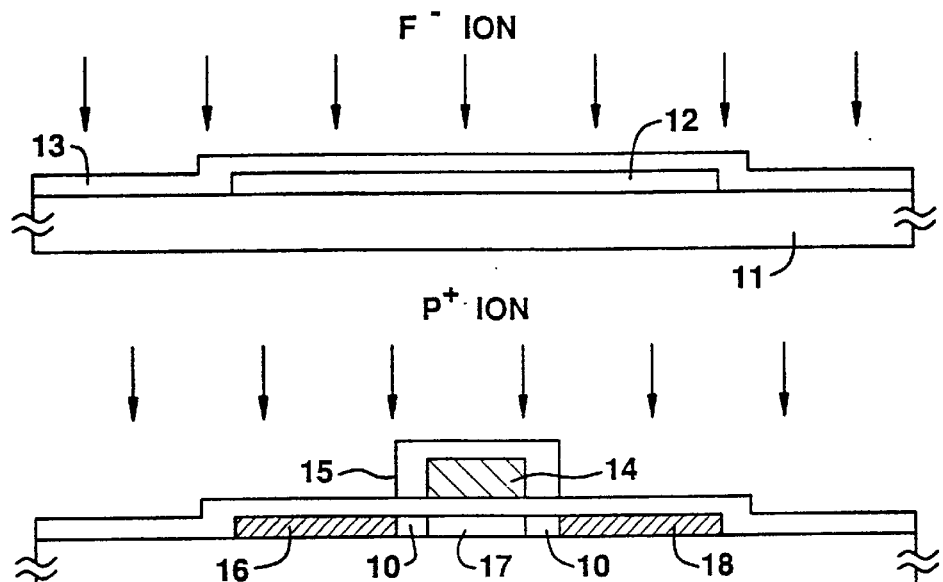
FIG.9B
FIG.9C
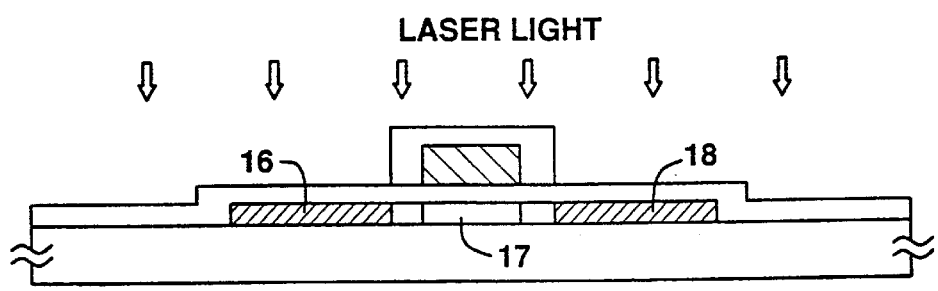
FIG.9D
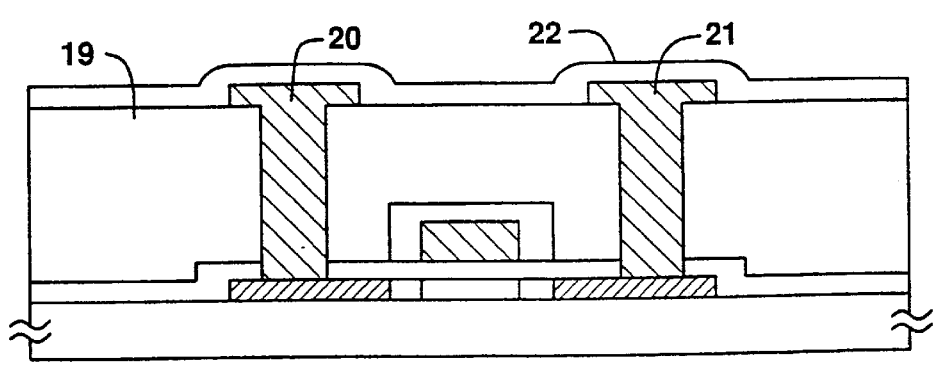
FIG.9E

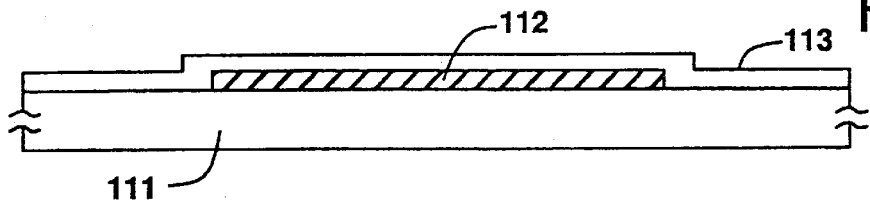
FIG.12A
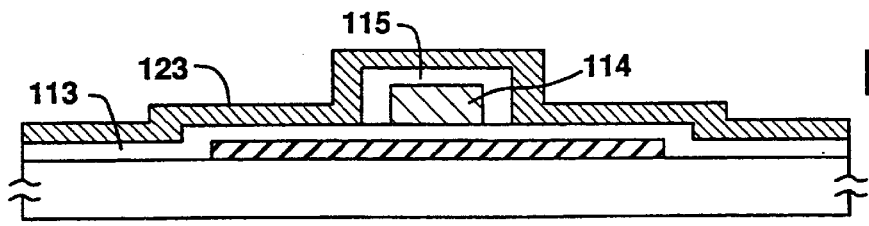
FIG.12B
FIG.12C
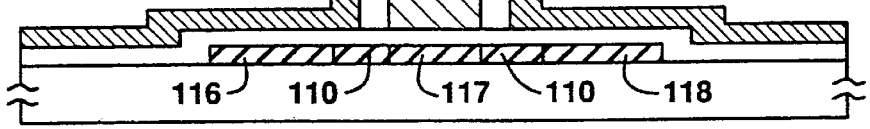
FIG.12D
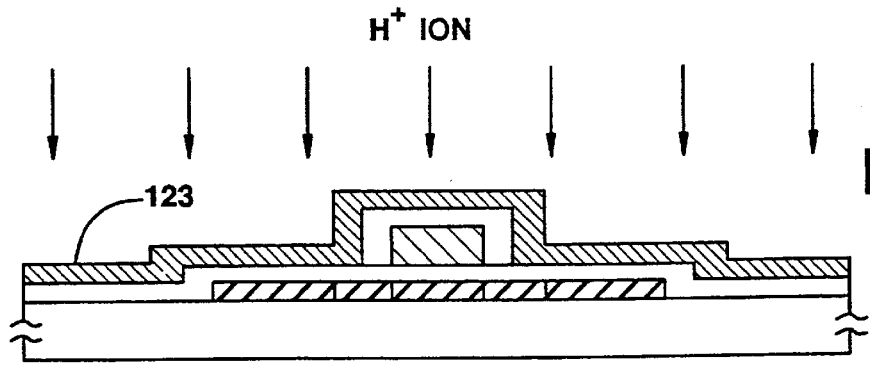
FIG.12E
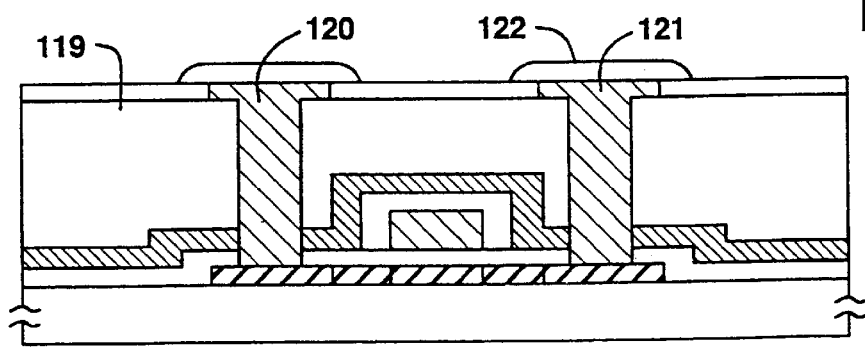

METHOD FOR PRODUCING SEMICONDUCTOR DEVICE

This application is a Divisional application of Ser. No. 08/757,292, filed Nov. 27, 1996 now U.S. Pat. No. 5,897,346; which itself is a Divisional application of Ser. No. 08/395,434, filed Feb. 28, 1995, now U.S. Pat. No. 5,620,906.

BACKGROUND OF THE INVENTION

The present invention relates to a method for producing a semiconductor device having good electrical properties and also to a method for forming a thin film transistor (TFT) with good electrical properties.

Among thin film semiconductor elements, the TFT is well known. TFT is composed of an insulating substrate such as glass substrate and a thin film semiconductor (usually silicon semiconductor) as an active layer formed thereon which is several hundreds to several thousands of angstroms in thickness. TFT is applied to an electro-optical device such as a liquid crystal display device and an image sensor. Picture elements and peripheral drivers are formed by TFT formed directly on a glass substrate.

In using a glass substrate, the thin film silicon semiconductor formed on the substrate has amorphous or crystalline. A structure having crystalline represents the polycrystal structure, microcrystal structure, or a mixture of amorphous and crystalline structures. TFT based on an amorphous semiconductor is slightly poor in operating speed and electrical properties, and limits its application. By contrast, TFT based on a crystalline silicon film is capable of high speed operation and has good electrical properties.

TFT based on a crystalline silicon film has a problem associated with off state current. When a negative voltage is applied to the gate electrode in an N-channel type TFT, a current does not flow between a source and a drain in principle. This is because, by applying the negative voltage, a channel becomes a P-type and therefore a PN-junction is formed between the source and the drain. In actual, the crystalline silicon film contains crystal grain boundaries, crystal defects, and dangling bonds, so that a large number of levels produce. Accordingly, charges move in the reverse direction of PN-junction through these levels. When an electric field is concentrated at the PN-junction, a current leaks in the reverse direction through the defects and traps as a result, an off current flows between the source and the drain by applying the negative voltage to the gate electrode.

A method to solve this problem is to form a lightly doped drain (LDD) region (lightly N-type), as an electric field relaxation region, between a channel (I-type) and a drain (N-type), which prevents the concentration of electric field between them.

Another method to obtain the same effect as the LDD region is to form an offset gate region which avoids the concentration of electric field between a channel and a drain. The offset gate region is a region which does not function as the drain between the channel and the drain.

As mentioned above, an off current of TFT decreases by defects and traps in the film. Also, defects and traps retard the movement of carriers in the film and therefore prevent the operation of TFT.

On the other hand, interface properties between a channel and a gate insulating film in TFT are extremely important. The interface properties greatly affect characteristics of TFT, and are evaluated in terms of interface level. The interface level produces by defects and dangling bonds. To obtain TFT having good characteristics, it is necessary to lower the interface level at the interface between the channel and the gate insulating film.

SUMMARY OF THE INVENTION

The object of the present invention is to solve the problems associated with an off current in a thin film transistor (TFT) and with an interface level at the interface between a channel and a gate insulating film. Therefore, The object of the present invention is to provide a method for lowering the level (related with dangling bonds) in thin film silicon semiconductor. Another object of the present invention is to provide TFT having good characteristics. Further another object of the present invention is to obtain a silicon semiconductor film having a less number of levels.

The present invention is embodied in a method for producing TFT comprising the steps of, forming a silicon semiconductor film on a substrate having an insulating surface, introducing into the silicon semiconductor film at least one of ionized and accelerated hydrogen, fluorine, and chlorine, and performing heat treatment on the silicon semiconductor film in an atmosphere containing one of hydrogen, fluorine, chlorine, and a mixture thereof.

The present invention is also embodied in a method for producing TFT comprising the steps of, forming an active layer, forming a gate insulating film on the active layer, forming a gate electrode on the gate insulating film, forming a silicon nitride film covering the gate insulating film and gate electrode, introducing hydrogen ions into the active layer through the gate insulating film and silicon nitride film, and performing heat treatment on the whole.

The substrate having an insulating surface includes a glass substrate, a glass substrate on which an insulating film is formed, a semiconductor substrate on which an insulating film is formed, a metal substrate on which an insulating film is formed, and other substrate made of an insulating material.

The silicon semiconductor film has amorphous silicon semiconductor and crystalline silicon semiconductor which are formed by plasma chemical vapor deposition (CVD) or low pressure heat CVD. An amorphous silicon film formed by CVD may be crystallized by heating or irradiation with a laser light or an equivalent intense light.

Hydrogen, fluorine, or chlorine ions may be implanted by using a well known ion implanting apparatus or a plasma doping apparatus. Ionization may be performed by producing plasma based on high frequency discharge or by mass separation. The ion implanting apparatus required in the present invention introduces, into the silicon semiconductor film, hydrogen, fluorine, or chlorine ions which an acceleration to voltage is applied.

When a plasma doping apparatus is used, it is possible to use hydrogen, chlorine, or fluorine as the doping gas. Hydrogen chloride, hydrogen fluoride, or the like can be used as the doping gas. In using hydrogen chloride as the doping gas, chlorine and hydrogen are introduced into the silicon semiconductor. A depth which each element is introduced varies depending on an ion and an acceleration voltage.

The purpose of heat treatment on the silicon semiconductor film in an atmosphere containing hydrogen, fluorine, chlorine, or a mixture thereof is to confine the introduced hydrogen atoms, fluorine atoms, or chlorine atoms in the silicon semiconductor and further to promote neutralization of dangling bonds caused by hydrogen, fluorine, or chlorine.

The heat treatment can be performed in any atmosphere irrespective of the previously introduced element. For example, heat treatment in an atmosphere containing hydrogen or chlorine after chlorine implantation is permissible. Selection depends on the apparatus to be used and the desired effect.

The atmosphere for heat treatment is not limited to that of single element; it may be a mixture of gases or a gaseous compound. An atmosphere containing a hydrogen-nitrogen mixture having a desired ratio or hydrogen chloride can be used.

The selection of hydrogen, chlorine, or fluorine for implantation depends on the apparatus employed and the characteristic required of the silicon semiconductor. In general, hydrogen implantation is easy. Deep implantation is possible with hydrogen (which is light in weight) at a low acceleration voltage. This almost avoids damages to the silicon semiconductor.

Deep implantation of fluorine or chlorine (which has larger ionic radius) needs a high acceleration voltage, which causes appreciable damages to the silicon semiconductor. However, these elements are not easily released by an external electric field because of their large ionic radius and their high bond energy for silicon. Chlorine, fluorine, and hydrogen decrease in bond energy for silicon in the order listed. The chlorine-silicon bond energy does not differ greatly from the fluorine-silicon bond energy; however, the hydrogen-silicon bond energy is extremely small. For example, the chlorine-silicon bond and fluorine-silicon bond begin to dissociate at 500° C., whereas the hydrogen-silicon bond begins to dissociate at 150–200° C. and completely decomposes at 350–500° C.

Implantation of hydrogen ions through the silicon nitride film which has previously been formed is intended to confine the introduced hydrogen ions in the active layer and to maintain their effect. That is, the silicon nitride film prevents the release of hydrogen, thereby enhancing the effect of hydrogen ion implantation and stabilizing the device.

The silicon nitride film functions as a barrier layer for the introduced hydrogen ions, viz, it prevents hydrogen from gasifying and releasing itself. An aluminum nitride film, aluminum oxide film, aluminum oxide nitride ($AlO_xN_y$) film, or silicon oxide nitride ($SiO_xN_y$) film is used as a barrier layer. Silicon oxide nitride film functions effectively also as a film to cover the device because of its ability to relax stress more than silicon nitride film.

The heat treatment performed on the whole is intended to confine the introduced hydrogen atoms in the silicon semiconductor and to neutralize dangling bonds with hydrogen. The heat treatment may be performed in an atmosphere containing $H_2$, $N_2$, Ar, He, or $O_2$. By this heat treatment, dangling bonds in the silicon film are neutralized with introduced hydrogen ions and hence the levels (traps) and defects due to dangling bonds are reduced.

The present invention is also embodied in a method for producing TFT comprising the steps of, forming a silicon semiconductor film on a substrate having an insulating surface, forming an insulating film on the silicon semiconductor film, and introducing at least one of ionized hydrogen, fluorine, and chlorine through the insulating film. The last step may be followed by heat treatment in an atmosphere containing hydrogen, fluorine, or chlorine, or a mixture thereof.

The present invention is also embodied in a method for producing TFT comprising the steps of, forming an active layer, forming a gate insulating film on the active layer, introducing hydrogen ions into the active layer through the gate insulating film, forming a gate electrode on the gate insulating film, forming a silicon nitride film covering the gate insulating film and gate electrode, introducing hydrogen ions into the active layer through the gate insulating film and silicon nitride film, and performing heat treatment on the whole.

In general, TFT that employs a silicon semiconductor film takes the structure of insulated gate type field effect transistor, with the gate insulating film being silicon oxide film or silicon nitride film. In this case, the characteristic of the interface between the silicon semiconductor film and the gate insulating film is extremely important. The implantation of hydrogen, chlorine, or fluorine ions, with the insulating film formed on the silicon semiconductor film, neutralizes dangling bonds of silicon in the silicon semiconductor and reduces an interface level at the interface between the silicon semiconductor and the insulating film. Since the interface level is due to dangling bonds, the implantation of hydrogen, fluorine, or chlorine neutralizes dangling bonds and reduces interface levels. Whether to implant hydrogen, chlorine, and fluorine individually or in combination depends on the apparatus employed and the characteristic desired.

The ion implantation can be performed such that the projected range of hydrogen, fluorine, and chlorine ions is in the neighborhood of the interface between the silicon semiconductor film and the insulating film. The projected range is an index representing a depth having the highest probability with respect to positions of ions introduced in the solid. Defining the projected range as above means that there exist hydrogen, chlorine, or fluorine mostly in the vicinity of the interface between the silicon semiconductor film and the insulating film.

FIGS. 18 and 19 show depth profiles of hydrogen ion concentration by SIMS. These depth profiles relate to a silicon wafer into which hydrogen ions are introduced. In FIG. 8, an acceleration voltage is 20 kv and a dose is $1\times10^{16}$ $cm^{-2}$. In FIG. 19, an acceleration voltage is 40 kV and a dose is $1\times10^{16}$ $cm^{-2}$. A thickness of the silicon wafer is about 500 $\mu$m or more. As can be seen from FIGS. 18 and 19, there are peaks representing a maximum ion concentration at desired depths. The depths are about 0.12 $\mu$m (FIG. 18) and about 0.22 $\mu$m (FIG. 19). Therefore, a depth of the peak changes in accordance with an acceleration voltage.

In FIG. 18, a hydrogen ion concentration in the depth of 0.12 $\mu$m is about $2\times10^{21}$ atoms/$cm^3$. Also, from FIG. 19, a minimum hydrogen ion concentration is about $5\times10^{17}$ atoms/$cm^3$. In general, a concentration of single crystalline silicon is about $5\times10^{22}$ $cm^{-3}$. As a result, a concentration of hydrogen ions introduced into the silicon wafer is within a range of about 0.001 to 5 atoms %.

Note that a depth profile of hydrogen ions introduced into an insulating film such as a silicon oxide film almost coincide with the above depth profiles with respect to the silicon wafer.

Therefore, since neutralization of dangling bonds in silicon is performed mainly in the vicinity of the interface between the silicon semiconductor film and the insulating film, it is possible to greatly reduce a level at the interface between the silicon semiconductor film and the insulating film. Since hydrogen, chlorine, and fluorine differ in mass, some elements would be present near the interface but other elements would not, if a plurality of elements are introduced. Which element should be present near the interface depends on the characteristic desired. In general, the interface characteristic would be stable if chlorine and fluorine are present near the interface, because the bond energy between chlorine and silicon or between fluorine and silicon is greater than that between hydrogen and silicon.

It is desirable that the projected range for hydrogen, fluorine, and chlorine ions be slightly shifted toward the silicon semiconductor film from the interface between the silicon semiconductor film and the insulating film. This is because dangling bonds in silicon (which are responsible for interface levels) are present more in the silicon semiconductor film.

After element implantation, when heat treatment is performed a desired temperature in an atmosphere containing hydrogen, fluorine, chlorine, or a mixture thereof, the hydrogen that neutralizes dangling bonds is confined. In other words, as the result of heat treatment, these elements terminate the dangling bonds due to ion implantation into the silicon semiconductor and the insulating film formed thereon, to obtain a stabler state. The atmosphere for heat treatment is independent of the element which has been introduced. It is not limited to that of single element; it may be a mixture of gases or a gaseous compound.

The present invention is also embodied in a method for producing TFT comprising the steps of, introducing an impurity for providing one conductivity type into the active layer using the gate electrode as a mask, to form the source and drain regions, and introducing at least one of hydrogen, fluorine, and chlorine into the source and drain regions.

FIGS. 3A to 3E show an example of the process which employs hydrogen for implantation. In FIG. 3B, phosphorus ions ($P^+$) are introduced by using as a mask the gate electrode 14 and its surrounding oxide layer 15, so that the source region 16 and the drain region 18 are formed. Then, hydrogen ions are implanted. The implantation of hydrogen ions may be performed before the implantation of phosphorus ions. The region (or junction portion) where the conductivity type of impurity changes is often subject to an application of an intense electric field. Such junction portions include PN-junction, PI-junction, and NI-junction. When there exist dangling bonds in the silicon semiconductor, in the insulating film, or in their interface, near the junction, electrons and holes released (emitted) by the intense electric field are captured by such dangling bonds. They function as the charge center and induce the semiconductor characteristic of N-type or P-type conductivity in the substantially intrinsic (I-type) semiconductor region.

Such dangling bonds can be terminated by hydrogen, chlorine, or fluorine. The effective introduction of these elements may be performed by ion implantation. Whether to use hydrogen, chlorine, and fluorine alone or in combination depends on the apparatus employed or the characteristic desired. After the element implantation, when heat treatment is performed at a desired temperature in an atmosphere containing hydrogen, fluorine, chlorine, or a mixture thereof, the heat treatment completes the hydrogenation and minimizes a level due to dangling bonds in silicon. That is, these elements terminate dangling bonds due to ion implantation into the silicon semiconductor and the insulating film formed thereon. This leads to a stabler state. The heat treatment may be performed in an atmosphere containing any element irrespective of the element used for the ion implantation. The atmosphere is not limited to that of single element; it may be a mixture of gases or a gaseous compound.

The present invention is embodied in a method for producing TFT comprising the steps of, introducing an impurity for providing one conductivity type into the active layer using the gate electrode as a mask to form the source and drain regions, irradiating the source and drain regions with a laser beam or an equivalent intense light to perform annealing, and introducing at least one species of hydrogen, fluorine, and chlorine into the source and drain regions.

FIGS. 4A to 4E show an example of the process which employs hydrogen for implantation. In FIG. 4B, phosphorus ions are introduced by using the gate electrode 14 and its surrounding oxide layer 15 as masks. In FIG. 4C, a laser light is irradiated to anneal the damage caused by the previous ion implantation and to activate the implanted phosphorus ions. Hydrogen which terminates dangling bonds in the silicon semiconductor releases from the silicon semiconductor. If the laser irradiation eliminates dangling bonds completely, there is no problem. However, since an irradiation time of a pulse laser is short, the laser irradiation tends to give great strains to the crystals. Accordingly, hydrogen ion implantation of FIG. 4D replenishs the hydrogen released from the silicon film as the results of ion implantation of FIG. 4B and laser irradiation of FIG. 4C. When heat treatment is performed on the whole in an atmosphere containing hydrogen as shown in FIG. 4E, hydrogen is confined in the silicon film to make the hydrogen ion implantation more effective.

In the present invention, the hydrogen ion implantation is performed through the layer that functions as a barrier layer, and then heat treatment is performed. Also, in the present invention, hydrogen ions are introduced into the active layer of silicon semiconductor film using the gate electrode as a mask. In plasma doping, $H^+$ ions, $H_2^+$ ions, and $H_3^+$ ions are introduced; however, the gate electrode blocks $H_2^+$ ions and $H_3^+$ ions having a large ionic radius. That is, the gate electrode functions as a mask for $H_2^+$ ions and $H_3^+$ ions.

The implantation of hydrogen, fluorine, or chlorine ions into the silicon semiconductor film, the insulating film, or the interface between them neutralizes dangling bonds in the silicon film and improves the electrical properties of the silicon film. Unlike the ordinary heat treatment in an atmosphere containing hydrogen, chlorine, or fluorine, the ion implantation permits the effective introduction of these elements into the silicon semiconductor film, the insulating film, or the interface between them. With the ordinary heating treatment, it is very difficult to penetrate chlorine or fluorine into crystalline silicon; this disadvantage is eliminated in this invention by implantation of electrically accelerated ions.

Implantation of hydrogen, fluorine, or chlorine ions into the silicon film with an insulating film formed thereon reduces a level at the interface between the silicon film and the insulating film. It is desirable that the projected range for hydrogen, fluorine, and chlorine ions be close to the interface between the silicon film and the insulating film. When a hydrogen ion is implanted after formation of the silicon nitride, and then heat treatment is performed in an atmosphere containing hydrogen, hydrogen atoms can be confined in the silicon film (owing to the action of the silicon nitride film), and the trap level and defects due to hydrogen can be effectively reduced.

When the ion implantation of impurity into the silicon film and the irradiation with a laser light are followed by the implantation of hydrogen, fluorine, or chlorine ions into the silicon film, these processes replenish the hydrogen (dangling bonds and interface levels which are produced in the silicon film, the insulating film, or the interface between them) released by the ion implantation and the laser irradiation.

In all the cases, hydrogen, chlorine, or fluorine ions is implanted and then heat treatment is performed in an atmosphere containing hydrogen, fluorine, or chlorine, or a mixture thereof. This heat treatment confines the introduced ions in the silicon film, to enhance the effect.

BRIEF DESCRIPTION OF THE DRAWINGS

FIGS. 9A to 9E are diagrams showing TFT forming processes in another embodiment;

FIGS. 10A to 10E, 11A to 11D, 12A to 12E, 13A to 13D, 14A to 14D, and 15A to 15D are diagrams showing TFT forming processes in another embodiments;

DETAILED DESCRIPTION OF THE PREFERRED EMBODIMENTS

The method of producing a thin film transistor (TFT) according to the present invention will be described with reference to the following examples. It is possible that steps in one example are combined with steps in another. That is, it is possible to perform ion implantation of hydrogen, fluorine. and chlorine in as many steps as required.

Embodiment 1

This embodiment demonstrates the production of TFT with a crystalline silicon film (thin film silicon semiconductor) formed on a substrate having an insulating surface. Hydrogen ion implantation is performed for this crystalline silicon film so as to eliminate dangling bonds and defects therein and to decrease traps therein.

Figure 1A:
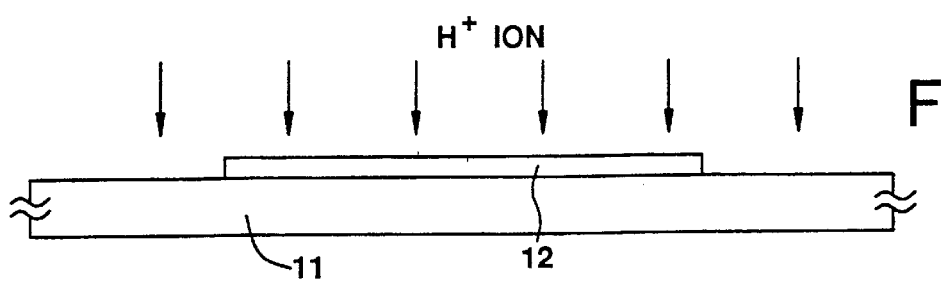
FIGS. 1A to 1E are diagrams showing TFT forming processes in an embodiment of the present invention.

In FIGS. 1A to 1E, TFT is formed on a glass substrate (Corning 7059) having an insulating surface. By sputtering, an underlying silicon oxide film, 2000 Å thick, (not shown) is formed on the glass substrate 11. An amorphous silicon film, 200–1000 Å thick, is formed by plasma CVD or low pressure heat CVD and then crystallized by heating or irradiation with a laser beam (or an equivalent intense light) or a combination thereof. The resulting crystalline silicon film is patterned to form an active layer 12 of desired shape. (FIG. 1A)

Figure 5:
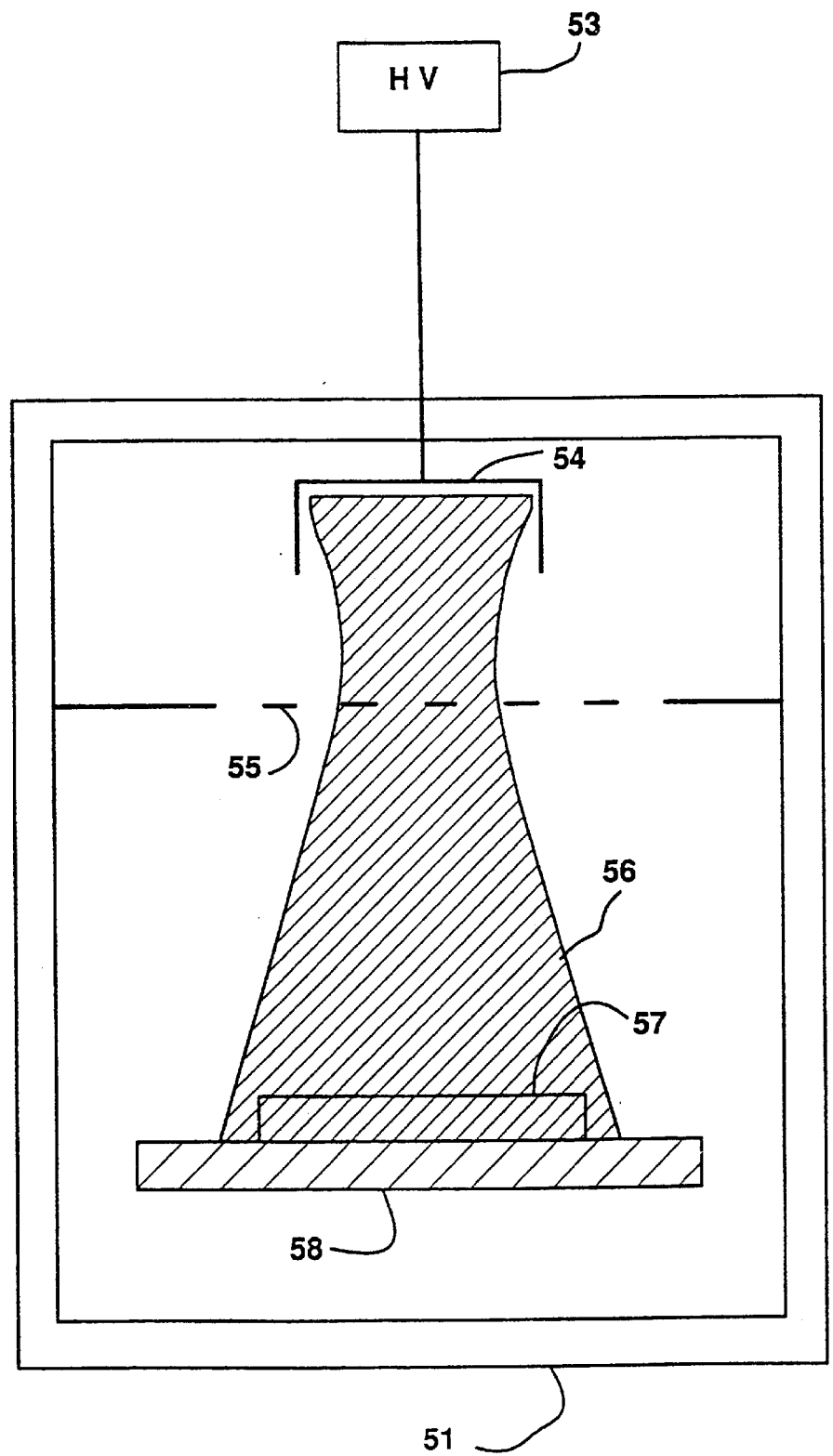
FIG. 5 is a diagram showing the apparatus used for ion implantation.

Hydrogen ion is implanted into the active layer 12 of crystalline silicon film using an apparatus of FIG. 5. This apparatus has a chamber 51, a sample holder (or substrate holder) 58 installed therein, an anode 54, a power source (HV) 53 for applying a high voltage to the anode 54, and a grid 55. To the anode 54, there is applied a voltage of 100 kV (at maximum) to produce about RF discharge in the vicinity of the grid 55. This discharge produces cations (positive ion) 56 accelerated toward the substrate (sample) 57 placed on the sample holder 58. The accelerated cations are introduced into the substrate 57.

Figure 1B:
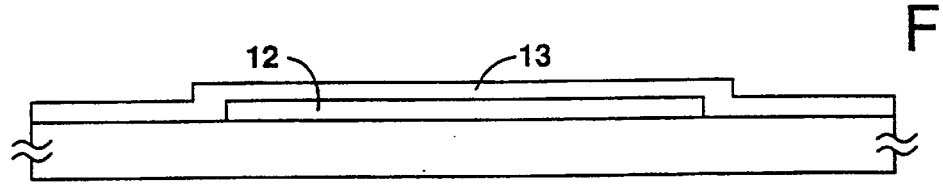

The acceleration voltage and dose for hydrogen ion implantation are 20 keV and $1 \times 10^{16}$ cm$^{-2}$, respectively. As shown in FIG. 1A, hydrogen ions are introduced into the active layer 12 of crystalline silicon film, so that internal defects and traps are decreased. Then, sputtering is performed to form a silicon oxide film 13, 500–5000 Å, for example, 1000 Å thick, which functions as the gate insulating film. (FIG. 1B)

Vapor deposition is performed to form a film, 5000 Å thick, which has mainly aluminum. This film is patterned to form a gate electrode 14. The gate electrode 14 is anodized to form an oxide layer 15, about 2000 Å thick, around it. The oxide layer 15 on side of the gate electrode 14 functions as a mask in the ion implantation of impurity for providing one conductivity type. The mask forms the offset gate region. Incidentally, the gate electrode may be formed from any other metal material, a semiconductor material, a laminate, or mixture thereof.

Phosphorus (P) ions are introduced into the regions 16 and 18. Since the oxide layer 15 functions as a mask, the region 10 can be formed as the offset gate region. Phosphorus ion implantation in this embodiment gives N-channel type TFT. Boron (B) ion implantation will give P-channel type TFT. (FIG. 1C)

Figure 1C:
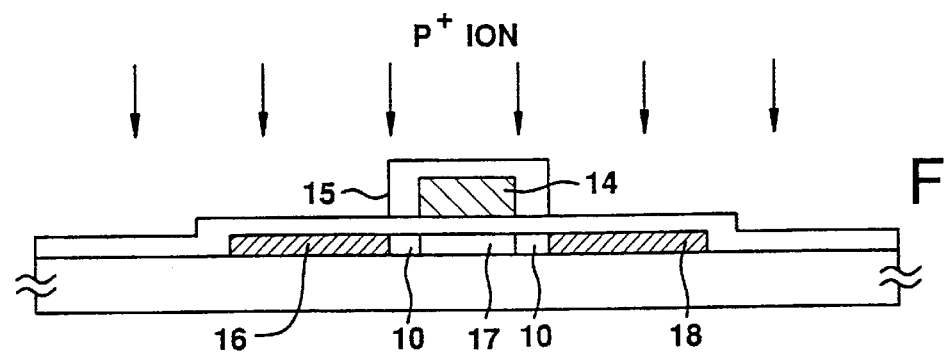
Figure 1D:
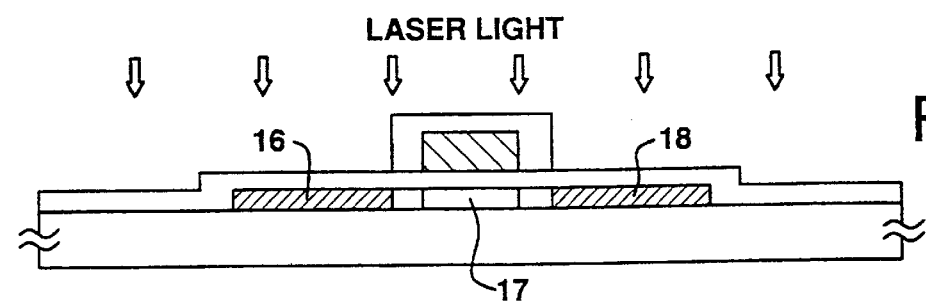

Annealing by irradiation with a laser light is performed to activate P ions introduced in FIG. 1C and to recover the damage caused by ion implantation, by using KrF excimer laser, with one to several shots at a power density of 100–300 mJ/cm$^2$. The effect of laser irradiation will be enhanced by simultaneous heating at about 300° C. In this way the source and drain regions 16 and 18 are formed. At the same time, the channel forming region 17 is formed by self-alignment. (FIG. 1D)

The laser for annealing may be replaced by an equivalent intense light such as infrared rays. With infrared ray, which are rarely absorbed by glass but are readily absorbed by silicon, it is possible to selectively heat only heat silicon. Such heating with infrared ray is called rapid thermal annealing (RTA). Annealing may be performed by using a heater.

When a silicon oxide film, about 8000 Å thick, as the interlayer insulating film 19, is formed by plasma CVD with tetraethoxysilane (TEOS). the heating temperature should be lower than 350° C. so as to prevent the release of the hydrogen ions introduced in FIG. 1A.

Figure 1E:
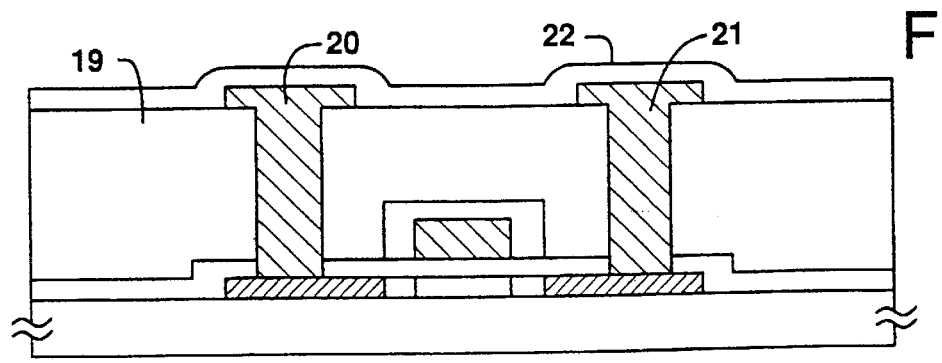

Patterning is performed to form holes for interconnect (wiring). Electrodes 20 and 21 are formed with aluminum or a multilayer film of aluminum and any other metal. A silicon nitride film 22. 1000–5000 Å thick, for example, 3000 Å thick, is formed as a final coating film. The silicon nitride film 22 may be formed from silane and ammonia by plasma CVD. (FIG. 1E)

Annealing for hydrogenation is performed at 200–500° C. for 1 hour in an atmosphere containing hydrogen under normal pressure. Thus the desired TFT is completed. Hydrogenation may be replaced by fluorination or chlorination. This annealing confines the introduced hydrogen in the active layer and reduces dangling bonds and defects in the active layer. After annealing, when a silicon nitride film is formed as a final coating film, releasing of hydrogen can be prevented.

Embodiment 2

This embodiment demonstrates the production of TFT with a crystalline silicon film as the active layer and a silicon oxide film as the gate insulating film. The crystalline silicon film is formed first and the silicon oxide film is formed thereon subsequently and hydrogen ion implantation is performed finally. This structure gives a good interface characteristic, with levels lowered at the interface between the crystalline silicon film and the silicon oxide film.

FIGS. 2A to 2E show the steps of producing TFT. In this embodiment, TFT is formed on a glass substrate (Corning 7059) having an insulating surface. By sputtering, an underlying silicon oxide film, 2000 Å thick, (not shown) is formed on the glass substrate 11.

Figure 2A:
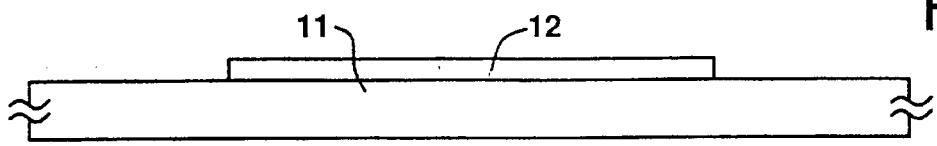
FIGS. 2A to 2E, 3A to 3E, and 4A to 4E are diagrams showing TFT forming processes in another embodiments.

An amorphous silicon film, 200–1000 Å thick, is formed by plasma CVD or low pressure heat CVD and then crystallized by heating or irradiation with a laser light (or an equivalent intense light) or a combination thereof. The resulting crystalline silicon film is patterned to form an active layer 12 of desired shape. (FIG. 2A)

Figure 2B:
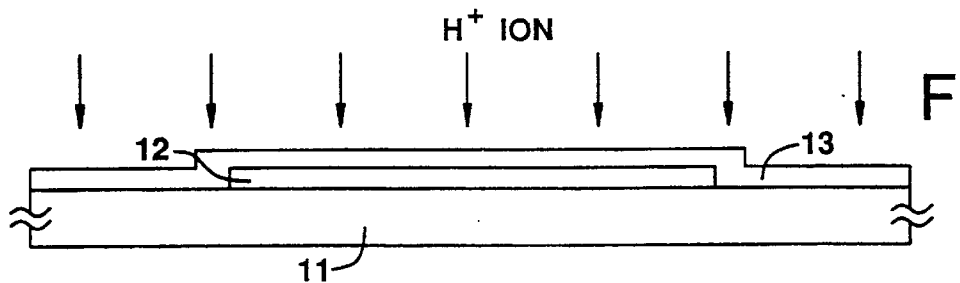

A silicon oxide film 13, 500–5000 Å, for example, 1000 Å thick, as the gate insulating film is formed by sputtering. Hydrogen ion is implanted into the active layer 12 of crystalline silicon film through the silicon oxide film 13 using the apparatus of FIG. 5. (FIG. 2B)

The acceleration voltage and dose for hydrogen ion implantation are 35 kev and $1 \times 10^{16}$ cm$^{-2}$, respectively, so that the projected range is close to the interface between the active layer and the silicon oxide film. As shown in FIG. 2B, by the hydrogen ion implantation, it is possible to reduce traps and defects in the interface between the active layer 12 and the silicon oxide film 13 and in the vicinity of the interface and also to obtain a good interface level.

Vapor deposition is performed to form a film, 5000 Å thick, which has mainly aluminum. This film is patterned to form the gate electrode 14. The gate electrode 14 is anodized to form an oxide layer 15, 2000 Å thick, around it. The gate electrode may be formed from any other metal material, a semiconductor material, a laminate or mixture thereof.

Phosphorus (P) ions are introduced into the regions 16 and 18. Since the oxide layer 15 functions as a mask, the region 10 can be formed as the offset gate region. Phosphorus ion implantation in the embodiment gives N-channel type TFT. Boron (B) ion implantation will give P-channel type TFT. (FIG. 2C)

Figure 2C:
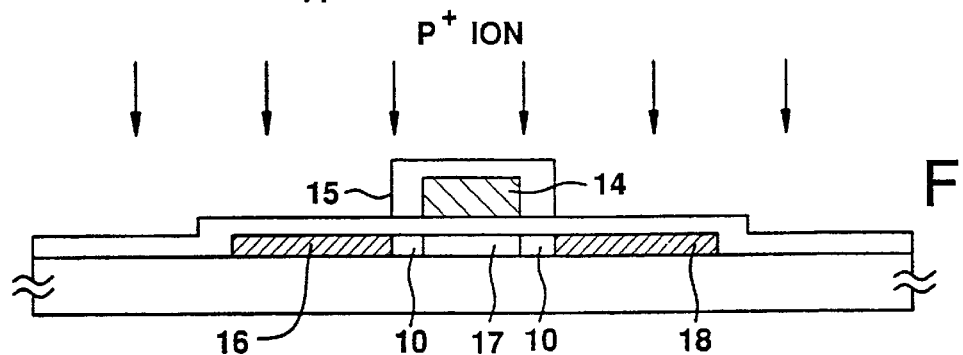
Figure 2D:
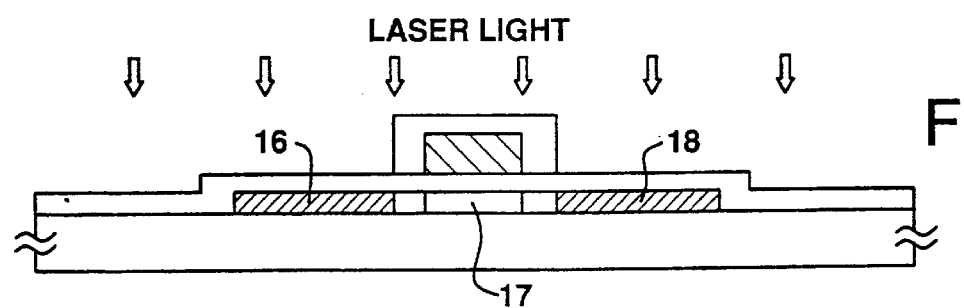

Annealing by irradiation with a laser light is performed to activate P ions introduced in FIG. 2C and to recover the damage caused by ion implantation, by using KrF excimer laser, with one to several shots at a power density of 100–300 mJ/cm$^2$. The effect of laser irradiation will be enhanced by simultaneous heating at about 300° C. In this way the source and drain regions 16 and 18 are formed. At the same time, the channel forming region 17 is formed by self-alignment. Further, the above annealing process may be replaced by the above mentioned RTA with infrared ray or heating. (FIG. 2D)

When a silicon oxide film, about 8000 Å thick, as the interlayer insulating film 19, is formed by plasma CVD with TEOS, the heating temperature should be lower than 350° C. so as to prevent the release of the hydrogen ions introduced in FIG. 2A.

Figure 2E:
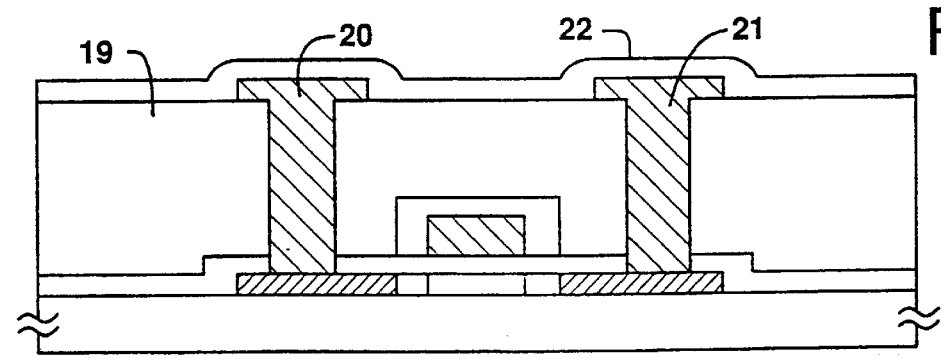

Patterning is performed to form holes for interconnect (wiring). The electrodes 20 and 21 are formed with aluminum or a multilayer film of aluminum and any other metal. A silicon nitride film 22 is formed as a final coating film. Annealing for hydrogenation is performed at 200–500° C. for 1 hour in an atmosphere containing hydrogen under normal pressure. Thus the desired TFT is completed. This annealing confines the introduced hydrogen ion in the active layer and reduces dangling bonds and defects in the active layer. (FIG. 2E)

In this embodiment, the silicon semiconductor film is formed first, the silicon oxide film is formed thereon subsequently, and hydrogen ion implantation is performed finally. This procedure effectively lowers a level at the interface between the silicon semiconductor film and the silicon oxide film. This structure may be applied to the active layer and gate insulating film of TFT to produce TFT having good characteristics.

Embodiment 3

This embodiment demonstrates the production of TFT. By implanting an impurity for providing one conductivity type using a gate electrode as a mask and then implanting H+ion (hydrogen ion), traps and defects in the source and drain regions, the junction between the source and drain regions and the substantially intrinsic region where the channel is formed, and the vicinity of the junction are eliminated.

Figure 3A:
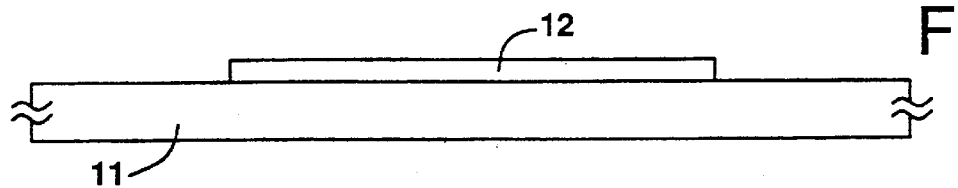

FIGS. 3A to 3E show the processes of producing TFT. In this embodiment, TFT is formed on a glass substrate (Corning 7059) having a silicon oxide film, 2000 Å thick, as an underlying film formed thereon. An amorphous silicon film, 200–1000 Å thick, is formed on the glass substrate 11 by plasma CVD or low pressure heat CVD and then is crystallized by hearing or irradiation with a laser light (or an equivalent intense light ) or a combination thereof. The resulting crystalline silicon film is patterned to form an active layer 12 of desired shape. (FIG. 3A)

A silicon oxide film 13, 500–5000 Å, for example, 1000 Å thick, as the gate insulating film is formed by sputtering. Vapor deposition is performed to form a film, 5000 Å thick, which has mainly aluminum. This film is patterned to form the gate electrode 14. The gate electrode 14 is anodized to form an oxide layer 15, 2000 Å thick, around it.

Phosphorus (P) ions are introduced into the regions 16 and 18. Since the oxide layer 15 functions as a mask, the region 10 can be formed as the offset gate region. (FIG. 3B)

Using an apparatus of FIG. 5, hydrogen ion implantation is performed at an acceleration voltage of 40 keV and a dose of $2 \times 10^{16}$ cm$^{-2}$. (FIG. 3C)

Figure 3B:
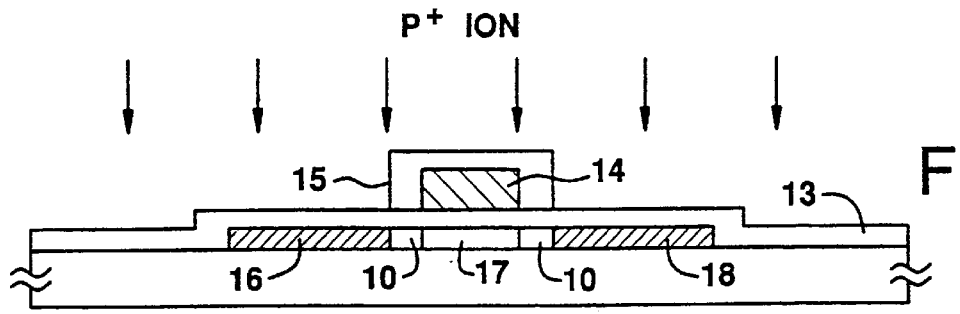
Figure 3C:
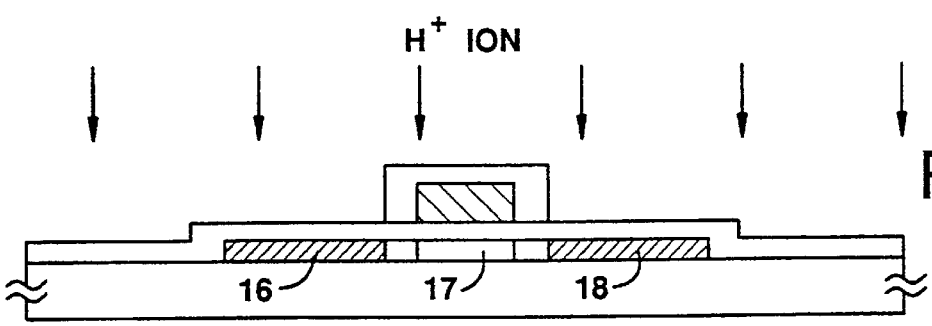
Figure 3D:
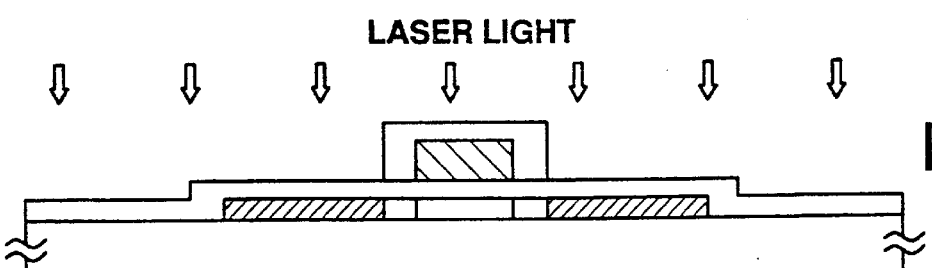

Annealing by irradiation with a laser light is performed to activate P ions introduced in FIGS. 3B and 3C and to recover the damage caused by ion implantation in FIGS. 3B and 3C, by using KrF excimer laser, with one to several shots at a power density of 100–300 mJ/cm$^2$. The effect of laser irradiation will be enhanced by simultaneous heating at about 300° C. This annealing may be replaced by the above mentioned RTA with infrared ray or heating. (FIG. 3D)

When a silicon oxide film, about 8000 Å thick, as the interlayer insulating film 19, is formed by plasma CVD with TEOS, a heating temperature should be lower than 350° C. so as to prevent the release of the hydrogen ions introduced in FIG. 3C.

Figure 3E:
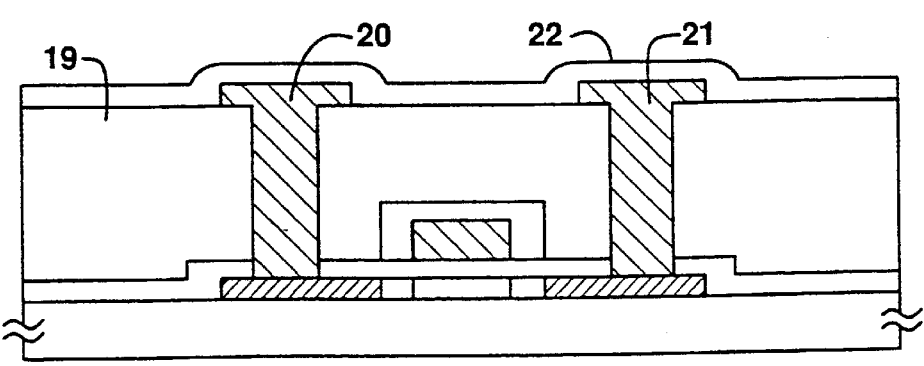

Patterning is performed to form holes for interconnect (wiring). The electrodes 20 and 21 are formed with aluminum or a multilayer film of aluminum and any other metal. Annealing for hydrogenation is performed at 200–500° C. for 1 hour in an atmosphere containing hydrogen under normal pressure. Thus the desired TFT is completed. (FIG. 3E)

Embodiment 4

This embodiment demonstrates the method of producing TFT including the steps of, introducing an impurity ion for providing one conductivity type using the gate electrode as a mask and then annealing to form the source and drain regions, and performing hydrogen ion implantation.

Figure 4A:
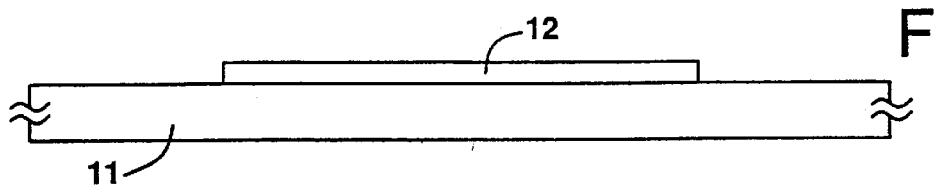

Using a glass substrate (Corning 7059) having a silicon oxide film, 2000 Å thick, as an underlying film formed thereon by sputtering. An amorphous silicon film, 200–1000 Å thick, is formed on the glass substrate 11 by plasma CVD or low pressure heat CVD and then crystallized by heating, irradiation with a laser light (or an equivalent intense light), or a combination thereof. The resulting crystalline silicon film is patterned to form an active layer 12 of desired shape. (FIG. 4A)

A silicon oxide film 13, 500–5000 Å, for example, 1000 Å thick, as the gate insulating film is formed by sputtering. Vapor deposition is performed to form a film, 5000 Å thick, which has mainly aluminum. This film is patterned to form the gate electrode 14. The gate electrode 14 is anodized to form an oxide layer 15, 2000 Å thick, around it.

Phosphorus (P) ions are introduced into the regions 16 and 18. Since the oxide layer 15 functions as a mask, the region 10 can be formed as the offset gate region. (FIG. 4B)

Figure 4B:
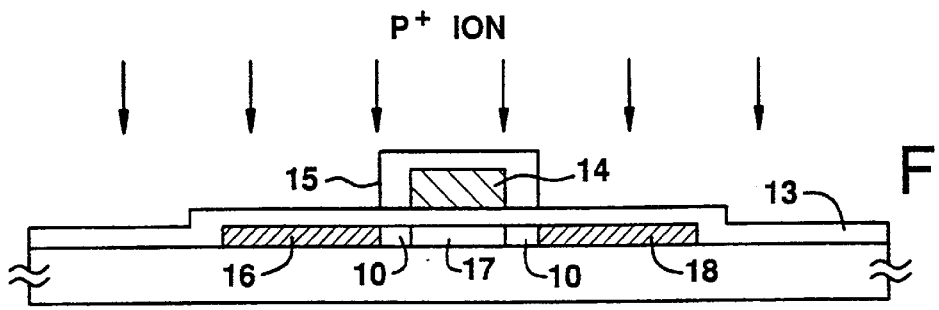
Figure 4C:
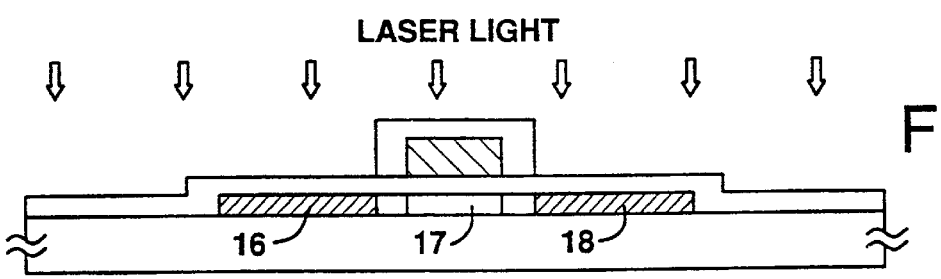

Annealing by irradiation with a laser light is performed to recover the damage caused by ion implantation in FIG. 4B, by using KrF excimer laser, with one to several shots at a power density of 100–300 mJ/cm$^2$. The effect of laser irradiation will be enhanced by simultaneous heating at about 300° C. (FIG. 4C)

Using an apparatus of FIG. 5, hydrogen ion implantation is performed at an acceleration voltage of 40 kev and a dose of 2 10$^{16}$ cm$^{-2}$. This process is intended to replenish the hydrogen released in ion implantation (FIG. 4B) and laser irradiation (FIG. 4D).

Figure 4D:
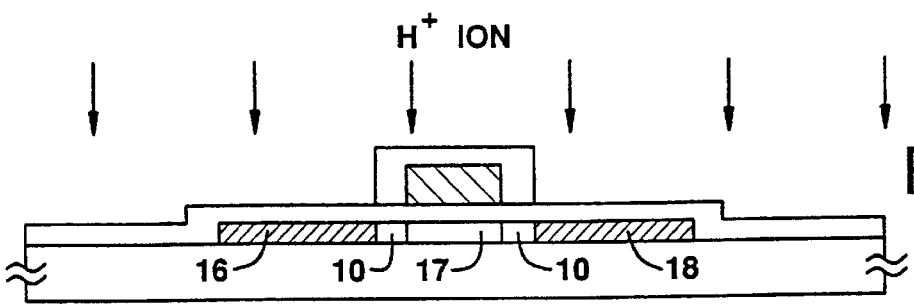

When a silicon oxide film, about 8000 Å thick, as the interlayer insulating film 19, is formed by plasma CVD with TEOS, the heating temperature should be lower than 350° C. so as to prevent the release of the hydrogen ions introduced in FIG. 4D.

Figure 4E:
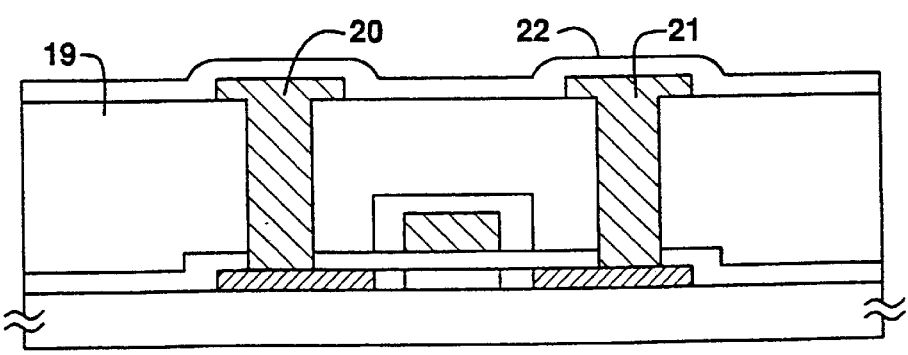

Patterning is performed to form holes for interconnect. The electrodes 20 and 21 are formed with aluminum or a multilayer film of aluminum and any other metal. A silicon nitride film 22 is formed as a final coating film. Annealing for hydrogenation is performed at 200–500° C. for 1 hour in an atmosphere containing hydrogen under normal pressure. Thus the desired TFT is completed. (FIG. 4E)

Embodiment 5

This embodiment demonstrates the production of TFT by the combination of the processes in Embodiments 1 and 4. The processes in this embodiment includes forming the gate electrode on the active layer, performing hydrogen ion implantation, performing ion implantation of an impurity for providing one conductivity type using the gate electrode as a mask, performing annealing, forming the source and drain regions, and performing the second ion implantation of hydrogen.

Figure 6A:
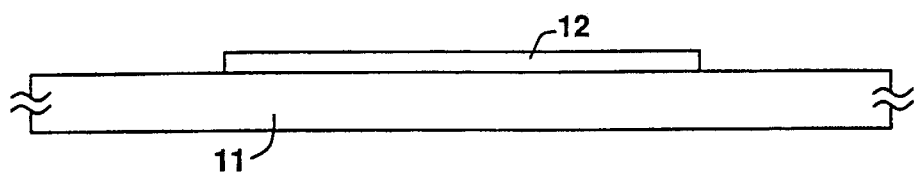
FIGS. 6A to 6E are diagrams showing TFT forming processes in another embodiment.

TFT is formed on a glass substrate (Corning 7059) having a silicon oxide film, 2000 Å thick, as an underlying film formed thereon by sputtering. An amorphous silicon film, 200–1000 Å thick, is formed on the glass substrate 11 by plasma CVD or low pressure heat CVD, as shown in FIG. 6A. Nickel (as a catalyst to promote crystallization) is introduced into the surface of the amorphous silicon film. The amorphous silicon film is crystallized by heat treatment at 550° C. for 8 hours. The resulting crystalline silicon film is patterned to form the active layer 12 of desired shape. (FIG. 6A)

Figure 6B:
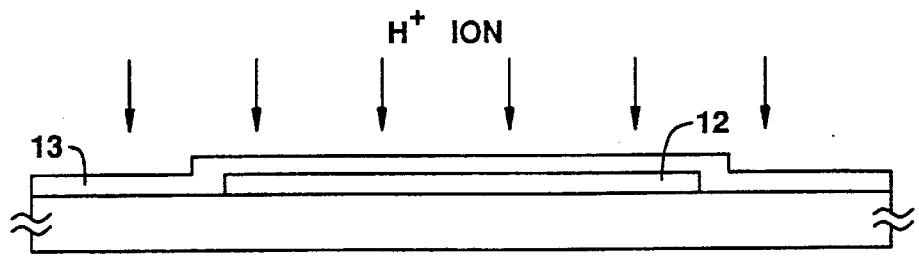

The silicon oxide film 13, 500–5000 Å. for example, 1000 Å thick, as the gate insulating film is formed by sputtering. Using an apparatus shown in FIG. 5, hydrogen ion implantation is performed at an acceleration voltage of 20 keV and a dose of 1×10$^{16}$ cm$^{-2}$. The projected range of hydrogen ions is set in just above the active layer. This hydrogen ion implantation reduces defects and traps in the active layer 12. It also reduces levels in the interface between the active layer 12 and the gate insulating film and in the vicinity of the interface. (FIG. 6B)

Vapor deposition is performed to form a film, 5000 Å thick, which has mainly aluminum. This film is patterned to form the gate electrode 14. The gate electrode 14 is anodized to form an oxide layer 15, for example, 2000 Å thick, around it.

Phosphorus (P) ions are introduced into the regions 16 and 18. Since the oxide layer 15 functions as a mask, the region 10 can be formed as the offset gate region. (FIG. 6C)

Figure 6C:
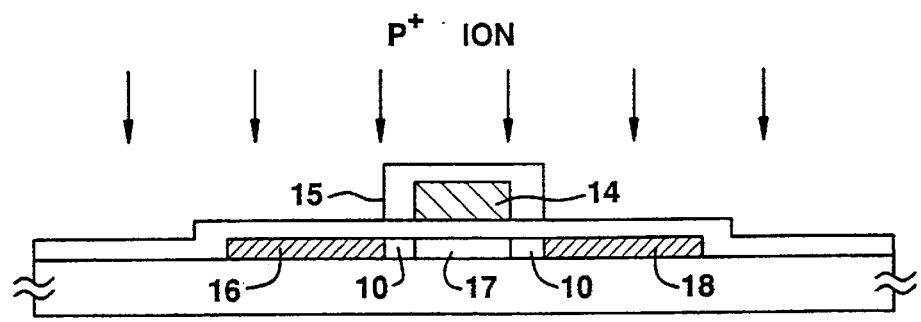

Annealing by irradiation with a laser light is performed to recover the damage caused by ion implantation in FIG. 6C, by using KrF excimer laser, with one to several shots at a power density of 100–300 mJ/cm$^2$. The effect of laser irradiation will be enhanced by simultaneous heating at about 300° C. In this way the source and drain regions 16 and 18 are formed.

Figure 6D:
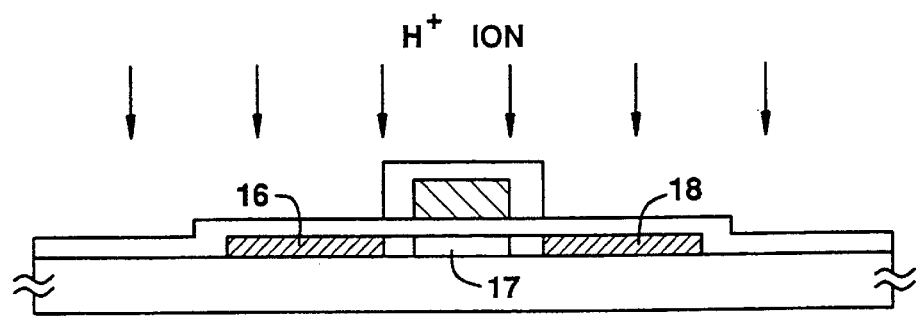

Using an apparatus of FIG. 5, hydrogen ion implantation is performed again at an acceleration voltage of 40 keV and a dose of 2×10$^{16}$ cm$^{-2}$, as shown in FIG. 6D. This process is intended to introduce hydrogen ions into the source and drain regions 16 and 18. The introduced hydrogen ions enter the offset region 10 and the channel forming region 17, thereby effectively reducing levels in these regions.

When a silicon oxide film, about 8000 Å thick, as the interlayer insulating film 19, is formed by plasma CVD with TEOS, the heating temperature should be lower than 350° C. so as to prevent the release of the hydrogen ions introduced in FIGS. 6B and 6D.

Figure 6E:
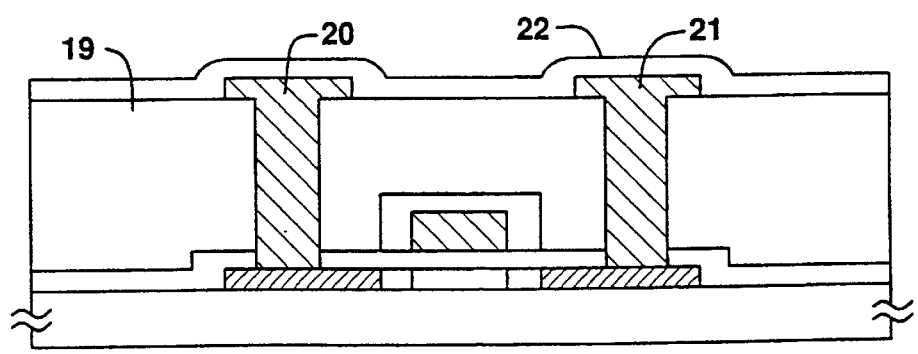

Patterning is performed to form holes for interconnect (wiring). The electrodes 20 and 21 are formed with aluminum or a multilayer firm of aluminum and any other metal. A silicon nitride film 22 is formed as a final coating film. Annealing for hydrogenation is performed at 200–450° C., for example, 360° C. for 1 hour in an atmosphere containing hydrogen under normal pressure. Thus the desired TFT is completed. (FIG. 6E)

Figure 7:
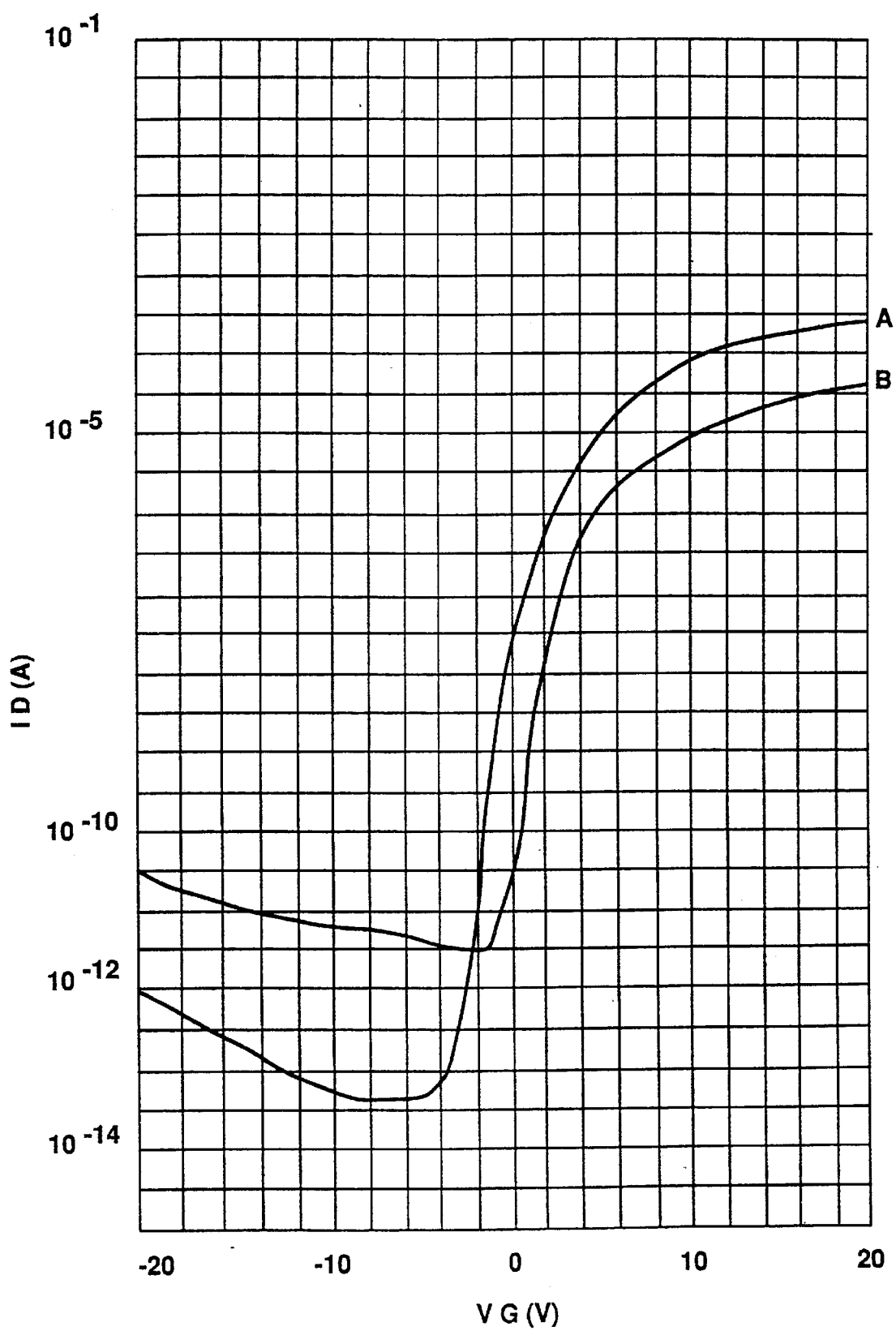
FIG. 7 is a diagram showing the characteristic of TFT.

The TFT obtained in this embodiment exhibits the characteristic as indicated by curve A in FIG. 7. The TFT obtained in this embodiment without performing hydrogen ion implantation, exhibits the characteristic as indicated by curve B in FIG. 7. The difference in characteristic indicated by curves A and B is due to the presence or absence of hydrogen ion implantation in FIGS. 6B and 6D. In FIG. 7, the TFT has a channel which is 5 μm in length and 5 μm in width and a VD of 1 V. The TFT in this embodiment is characterized by that the off current is small and the on current is large. That is, it is superior in on/off ratio. By contrast, the TFT without hydrogen ion implantation is characterized by that the off current is large and the on state current is small.

Figure 8:
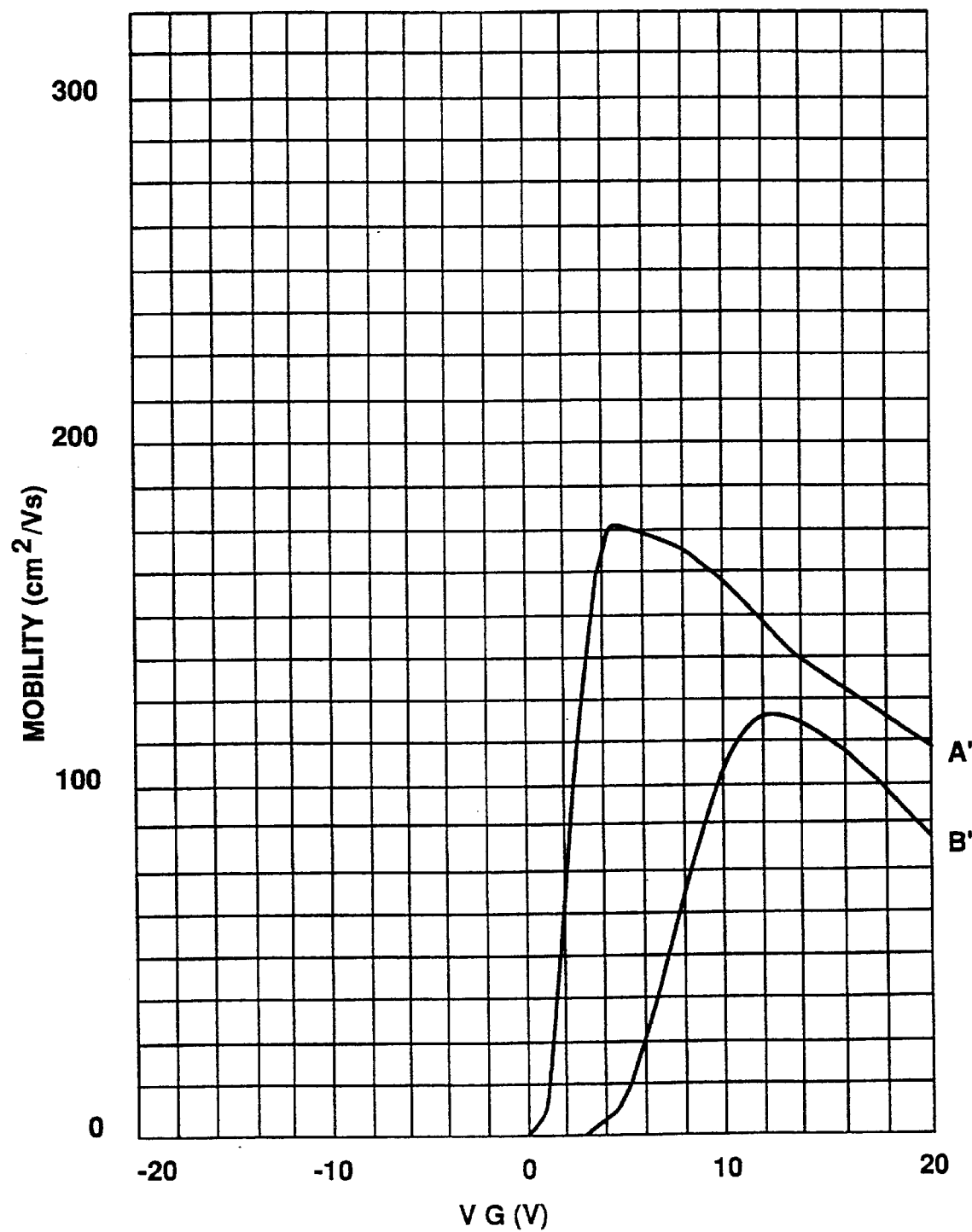
FIG. 8 is a diagram showing the mobility of carries in TFT.

Curve A' in FIG. 8 shows the mobility in TFT corresponding to curve A in FIG. 7. Curve B' in FIG. 8 also shows the mobility in TFT corresponding to curve B in FIG. 7. The TFT has a channel which is 5 μm in length and 5 μm in width and a VD of 1 V. From FIG. 8, the hydrogen ion implantation in this embodiment contributes to TFT having a high mobility.

Embodiment 6

This embodiment demonstrates the production of TFT in which a crystalline silicon film is used as the active layer and a silicon oxide film is used as the gate insulating film. The crystalline silicon film and silicon oxide film are formed such that levels at the interface between them are reduced and the interface has good properties. This is achieved by forming the crystalline silicon film and subsequently the silicon oxide film thereon and finally introducing fluorine ions.

FIGS. 9A to 9E show the steps of forming TFT in this embodiment. TFT is formed on a glass substrate (Corning 7059) having an insulating surface. A silicon oxide film, 2000 Å thick. as an underlying film (not shown) is formed on the glass substrate 11 by sputtering. An amorphous silicon film, 200–1000 Å thick, is formed thereon by plasma CVD or low pressure heat CVD and then crystallized by heating or irradiation with a laser light or an equivalent intense light, or a combination thereof. The crystalline silicon film is patterned to form the active layer 12 of desired shape. (FIG. 9A)

A silicon oxide film 13, 500–5000 Å, for example, 1000 Å thick, as the gate insulating film is formed by plasma CVD with TEOS and oxygen. The resulting silicon oxide film 13 contains a large amount of hydrogen, typically $10^{21}$ atoms/$cm^3$, which is confirmed by the secondary ion mass analysis (SIMS).

Using an apparatus of FIG. 5, fluorine ions are introduced into the active layer 12 (or crystalline silicon film) through the silicon oxide film 13. Fluorine gas or tetrafluorosilicon ($SiF_4$) may be used as the doping gas. (FIG. 9B)

In this embodiment, the fluorine ion implantation is performed at an acceleration voltage of 35 keV and a dose of $1\times10^{16}$ $cm^{-2}$ so that the projected range is in the vicinity of the interface between the active layer and the silicon oxide film. The fluorine ion implantation reduces traps and defects in the interface between the active layer 12 (or crystalline silicon film) and the silicon oxide film 13 and in the vicinity of the interface, thereby to obtain a good interface level. The fluorine ion implantation may be followed by heat treatment at 200–500° C. to enhance its effect. This process releases hydrogen in the silicon film and silicon oxide film. By the release of hydrogen, a large number of dangling bonds of silicon produce; however, they are immediately terminated by fluorine previously introduced by ion implantation. As a result, since a firm silicon-fluorine bond which is not readily dissociated by external electric field. This is desirable for the reliability of the device.

Vapor deposition is performed to form a film, 5000 Å thick, which has mainly aluminum. This film is patterned to form the gate electrode 14. The gate electrode 14 is anodized to form an oxide layer 15, 2000 Å thick, around it. The gate electrode may be formed from any other metal material, a semiconductor material, a laminate or mixture thereof.

Phosphorus (P) ions are introduced into the regions 16 and 18, by using a plasma doping apparatus and phosphine ($PH_3$) as the doping gas. Since the oxide layer 15 functions as a mask, the region 10 can be formed as the offset gate region. Phosphorus ion implantation in this embodiment gives N-channel type TFT. Boron ion implantation gives P-channel type TFT. Phosphine as the doping gas permits the simultaneous implantation of phosphorus ions and hydrogen ions. (FIG. 9C)

Annealing by irradiation with a laser light is performed to activate phosphorus ions introduced in FIG. 9C and to recover the damage caused by ion implantation, by using KrF excimer laser with one to several shots at a power density of 100–300 $mJ/cm^2$. The effect of laser irradiation will be enhanced by simultaneous heating at about 300° C. In this way the source and drain regions 16 and 18 are formed. Also, the channel forming region 17 is formed by self-alignment. (FIG. 9D)

This annealing may be replaced by the above mentioned RTA with infrared ray or heating. Heat treatment at 350–500° C. in a non-hydrogen atmosphere (such as dry nitrogen atmosphere) is performed before or after the irradiation with a laser or an equivalent intense light. This process removes hydrogen from the coating film. The plasma doping used in the present invention causes a large amount of hydrogen to be introduced into the silicon film at the time of phosphorus ion implantation. The thus introduced hydrogen combines with silicon to form unstable hydrogen-silicon bonds. The above mentioned heat treatment promotes the release of hydrogen and effectively converts unstable hydrogen-silicon bonds into stable fluorine-silicon bonds.

When a silicon oxide film, about 8000 Å thick, as the interlayer insulating film 19, is formed by plasma CVD with TEOS, the heating temperature may be higher than 350° C. because there are firm fluorine-silicon bonds formed in FIG. 9B. This embodiment differs from Embodiment 2 in this respect. As a result, a dense silicon oxide film which prevents the device from changing with time can be formed. The higher film forming temperature leads to a dense silicon nitride film which can be used as the interlayer insulating film.

Patterning is performed to form holes for interconnect. The electrodes 20 and 21 are formed with aluminum or a multilayer film of aluminum and any other metal. A silicon nitride film 22 is formed as a final coating film. (FIG. 9E)

Unlike Embodiment 2, this embodiment does not need annealing for hydrogenation after the completion of the device. By forming the silicon semiconductor film, forming the silicon oxide film thereon, and introducing fluorine ions, levels in the interface between the silicon semiconductor film and the silicon oxide film thereon can be decreased. Applying this structure to the active layer and gate insulating layer of TFT results in TFT having good characteristics. Also, the stable silicon-fluorine bond prevents the device from deterioration by high voltage. Thus the TFT having highly reliable can be obtained.

Embodiment 7

This embodiment demonstrates the production of TFT. Traps and defects eliminate in the source and drain regions, in the junction between the source and drain regions and the substantially intrinsic region where the channel is formed, and in the vicinity of such regions. Such achievement is due to chlorine ion implantation which follows the implantation of an impurity for providing one conductivity type, using the gate electrode as a mask.

Figure 10A:
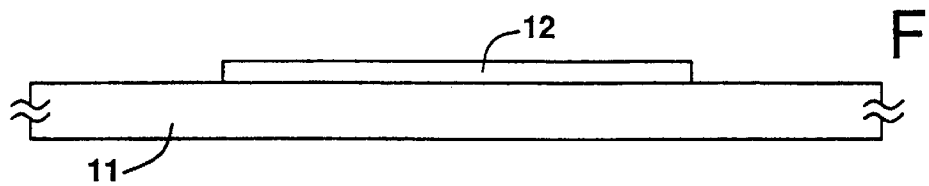

FIGS. 10A to 10E show the processes of forming TFT in this embodiment. TFT is formed on a glass substrate (Corning 7059) having, as an insulating surface, a silicon oxide film, 2000 Å thick, formed thereon. An amorphous silicon film, 200–1000 Å thick, is formed on the glass substrate by plasma CVD or low pressure heat CVD and then crystallized by heating or irradiation with a laser light or an equivalent intense light, or a combination thereof. The crystalline silicon film is patterned to form the active layer 12 of desired shape. (FIG. 10A)

A silicon oxide film 13, 500–5000 Å, for example, 1000 Å thick, as the gate insulating film is formed by sputtering. Vapor deposition is performed to form a film, 5000 Å thick, which has mainly aluminum. This film is patterned to form the gate electrode 14. The gate electrode 14 is anodized to form the oxide layer 15, for example, 2000 Å thick, around it.

Phosphorus (P) ions are introduced into the regions 16 and 18, by using a plasma doping apparatus and phosphine ($PH_3$) as the doping gas, as in Embodiment 6. Since the oxide layer 15 functions as a mask, the region 10 can be formed as the offset gate region. (FIG. 10B)

Using the apparatus of FIG. 5, chlorine ion implantation is performed at an acceleration voltage of 40 keV and a dose of $1\times10^{16}$ cm$^{-2}$. The doping gas is chlorine gas. (FIG. 10C)

Figure 10B:
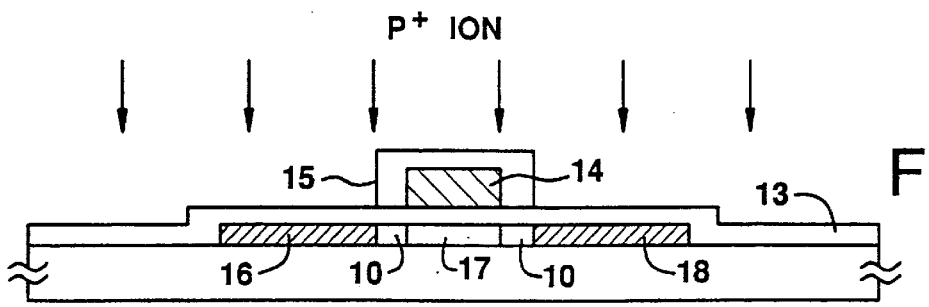
Figure 10C:
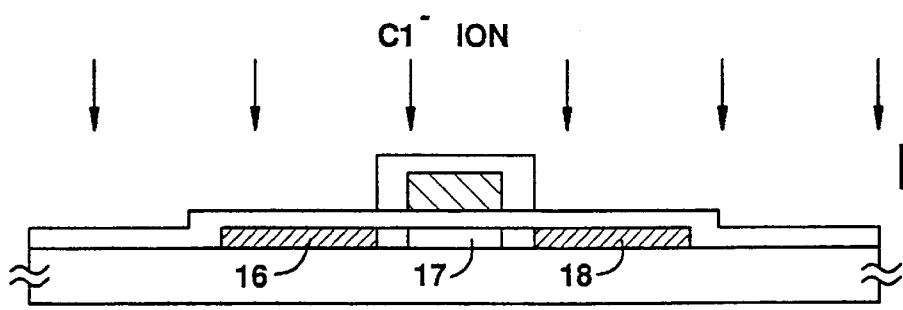
Figure 10D:
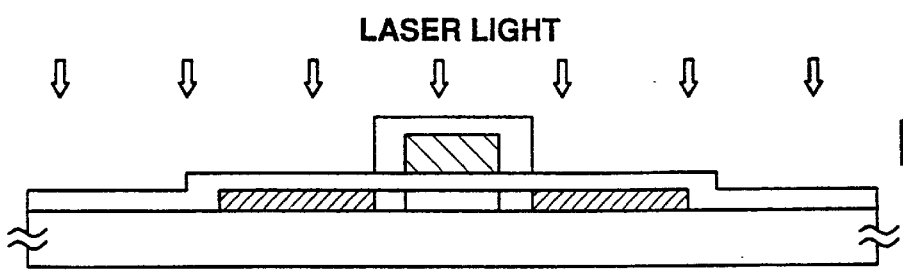

Annealing by irradiation with a laser light is performed to activate phosphorus ions introduced in FIGS. 10B and 10C and to recover the damage caused by ion implantation in FIGS. 10B and 10C, by using KrF excimer laser with one to several shots at a power density of 100–300 mJ/cm$^2$. The effect of laser irradiation will be enhanced by simultaneous heating at about 300° C.(FIG. 10D)

This annealing may be replaced by the above mentioned RTA with infrared ray or heating. Heat treatment at 350–500° C. in a non-hydrogen atmosphere (such as dry nitrogen atmosphere) may be performed before the chlorine ion implantation or before or after the irradiation with a laser light or an equivalent intense light. This process removes hydrogen from the coating film. The plasma doping used in the present invention causes a large amount of hydrogen to be introduced into the silicon film at the time of phosphorus ion implantation. The introduced hydrogen combines with silicon to form unstable hydrogen-silicon bonds. The above mentioned heat treatment promotes the release of hydrogen and effectively converts unstable hydrogen-silicon bonds into stable fluorine-silicon bonds.

Figure 10E:
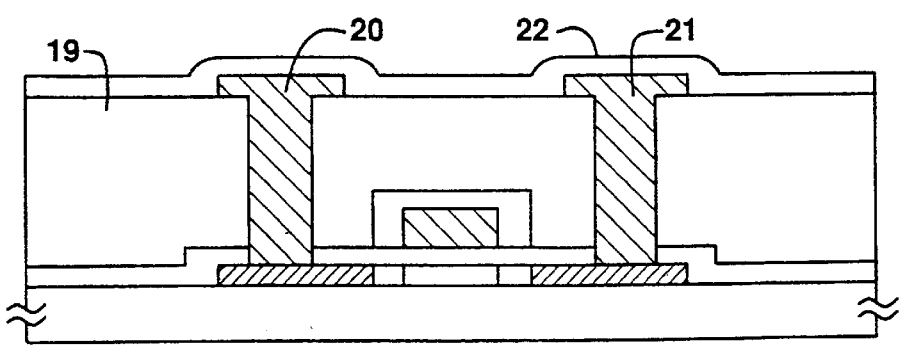

A silicon oxide film, about 8000 Å thick, as the interlayer insulating film 19, is formed by plasma CVD with TEOS. Patterning is performed to form holes for interconnect (wiring). The electrodes 20 and 21 are formed with aluminum or a multilayer film of aluminum and any other metal. A silicon nitride film (passivation film) 22 is formed. In this way the device is completed. (FIG. 10E)

Ion implantation of at least one of hydrogen, fluorine, and chlorine into the silicon semiconductor film and the insulating film or the interface between them neutralizes dangling bonds in these regions and reduces levels in the interface. The semiconductor film introduced with at least one of hydrogen ion, fluorine ion, and chlorine ion contributes to TFT with high reliability and characteristic.

Embodiment 8

This embodiment demonstrates the production of TFT which has a crystalline silicon film formed on a substrate having an insulating surface. In the crystalline silicon film, dangling bonds and defects eliminate and traps reduces by hydrogen ion implantation.

Figure 11A:
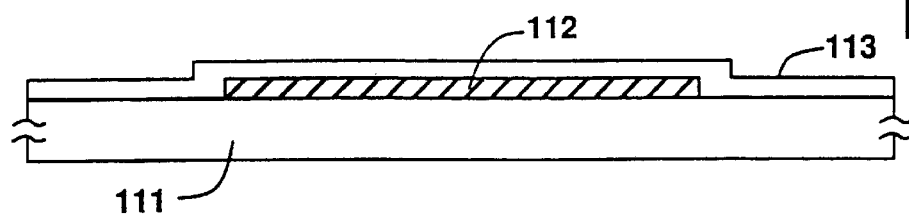

FIGS. 11A to 11D show the processes of forming TFT in this embodiment. A silicon oxide film as an underlying layer, 2000 Å thick, (not shown) is formed by sputtering on a glass substrate 111 (Corning 7059) having an insulating surface. An amorphous silicon film, 200–1000 Å thick, is formed thereon by plasma CVD or low pressure heat Cvb and crystallized by heating or irradiation with a laser light (or an equivalent intense light) or a combination thereof. The resulting crystalline silicon film is patterned to form an active layer 112 of desired shape. (FIG. 11A)

A silicon oxide film 113, 500–5000 Å, for example, 1000 Å thick, as the gate insulating film is formed by sputtering. Vapor deposition is performed to form a film, 5000 Å thick, which has mainly aluminum. This film is patterned to form a gate electrode 114. The gate electrode 114 is anodized to form an oxide layer 115, 2000 Å thick, around it. The oxide layer 115 on the side of the gate electrode 114 functions as a mask in ion implantation of impurity for providing one conductivity type, to form the offset gate region. The gate electrode may be formed from any other metal material, a semiconductor material, a laminate or mixture thereof. (FIG. 11B)

Phosphorus (P) ions are introduced into regions 116 and 118. Since the oxide layer 115 functions as a mask, the region 110 can be formed as the offset gate region. Phosphorus ion implantation in this embodiment gives n-channel type TFT. Boron ion implantation will give P-channel type TFT.

Figure 11B:
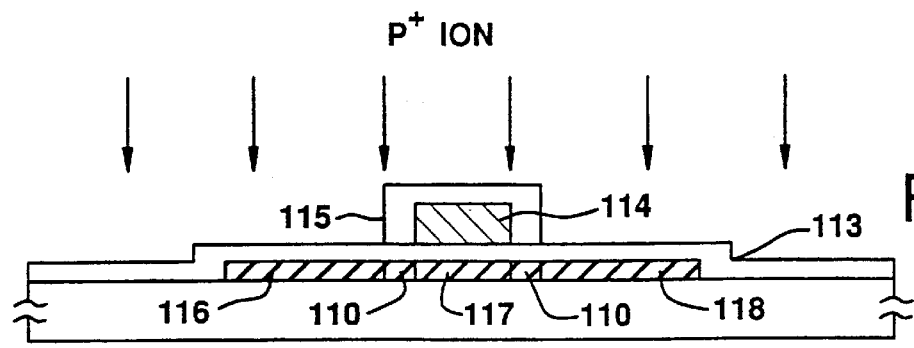

Annealing by irradiation with a laser light is performed to activate phosphorus ions introduced in FIG. 11B and to recover the damage caused by ion implantation, by using KrF excimer laser with one to several shots at a power density of 100–300 mJ/cm$^2$. The effect of laser irradiation will be enhanced by simultaneous heating at about 300° C. In this way the source and drain regions 16 and 18 are formed. Also, the channel forming region 17 is formed by self-alignment.

The laser for annealing may be replaced by an equivalent intense light such as infrared ray. With infrared ray which is rarely absorbed by glass but is readily absorbed by silicon, it is possible to selectively heat only silicon. Such heating with infrared ray is called rapid thermal annealing (RTA). Annealing may also be performed by using a heater.

A silicon nitride film 123 ($Si_3N_{4-x}$ ($-0.3 \leq x \leq 1$)), 1000 Å thick, is formed by plasma CVD with silane and ammonia as raw gas.

Hydrogen ions are introduced by ion doping at an acceleration voltage of 40 keV and a dose of $1\times10^{16}$ cm$^{-2}$ through the silicon nitride film 123. The introduced hydrogen ions are confined in the active layer because of the presence of the silicon nitride film 123. That is, a state can be obtained in which the introduced ions are not released outside. (FIG. 11C)

The plasma doping is used because of its high productivity. Although ion doping would be possible for hydrogen ion implantation, since it needs mass separation, it is poor in productivity when applied to a large area.

In plasma doping in this embodiment, $H^+$ ions, $H_2^+$ ions, and $H_3^+$ ions are introduced. $H^+$ ions pass through the gate electrode and reach the channel forming region 117. However, $H_2^+$ ions and $H_3^+$ ions having a large ionic radius are blocked by the gate electrode 114 and hence they are introduced into the source and drain regions 116 and 118. Introducing hydrogen ions into the source and drain regions through the silicon nitride film (as a barrier layer) is so effective that it is possible to obtain a considerable effect without introducing hydrogen ions into the channel forming region. Therefore, it is possible to obtain a considerable effect with the plasma doping which introduces hydrogen ions mainly into the source and drain regions. Also, plasma doping is superior in productivity because of its capability to introduce ions into a large area.

Figure 11C:
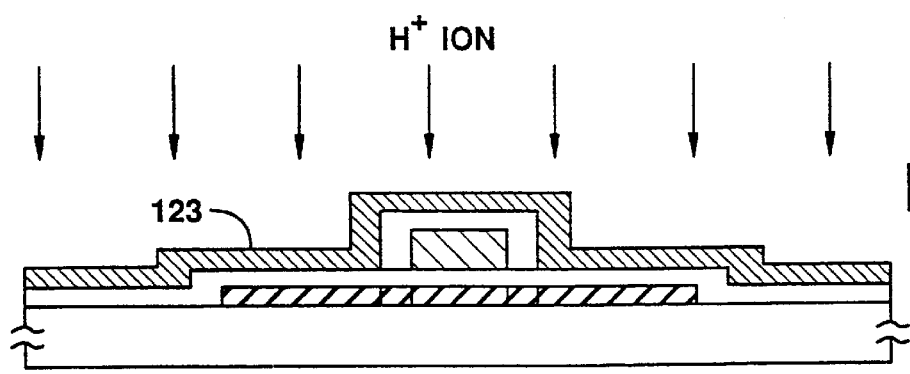

When a silicon oxide film (about 8000 Å thick, as an insulating film 119) is formed by plasma CVD with TEOS, the heating temperature should be lower than 350° C. so as to prevent the release of hydrogen ions introduced in FIG. 11C. The presence of the silicon nitride film 123 prevents the release of hydrogen in this process.

Figure 11D:
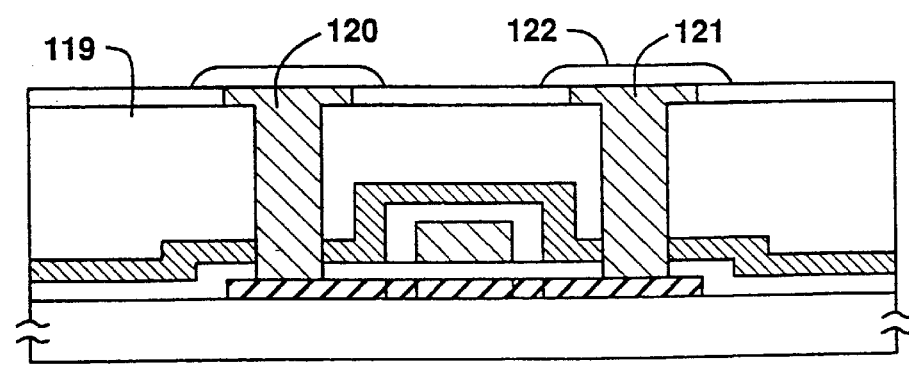

Patterning is performed to form holes for interconnect (wiring). The electrodes 120 and 121 are formed with aluminum or a multilayer film of aluminum and any other metal. A silicon nitride film 122 (as final coating film), 1000–5000 Å thick, for example 3000 Å thick, is formed by plasma CVD with silane and ammonia as raw gas. (FIG. 11D)

Annealing for hydrogenation is performed at 200–500° C. for 1 hour in an atmosphere containing hydrogen under normal pressure. Thus the desired TFT is completed. This annealing confines the hydrogen introduced in FIG. 11A in the active layer and reduces dangling bonds and defects in the active layer. The silicon nitride film (as the final coating film) formed after the annealing for hydrogenation prevents the release of hydrogen. In this process, hydrogen enters the active layer through the contact holes of the electrodes 120 and 121, so that the active layer is hydrogenated.

Figure 17:
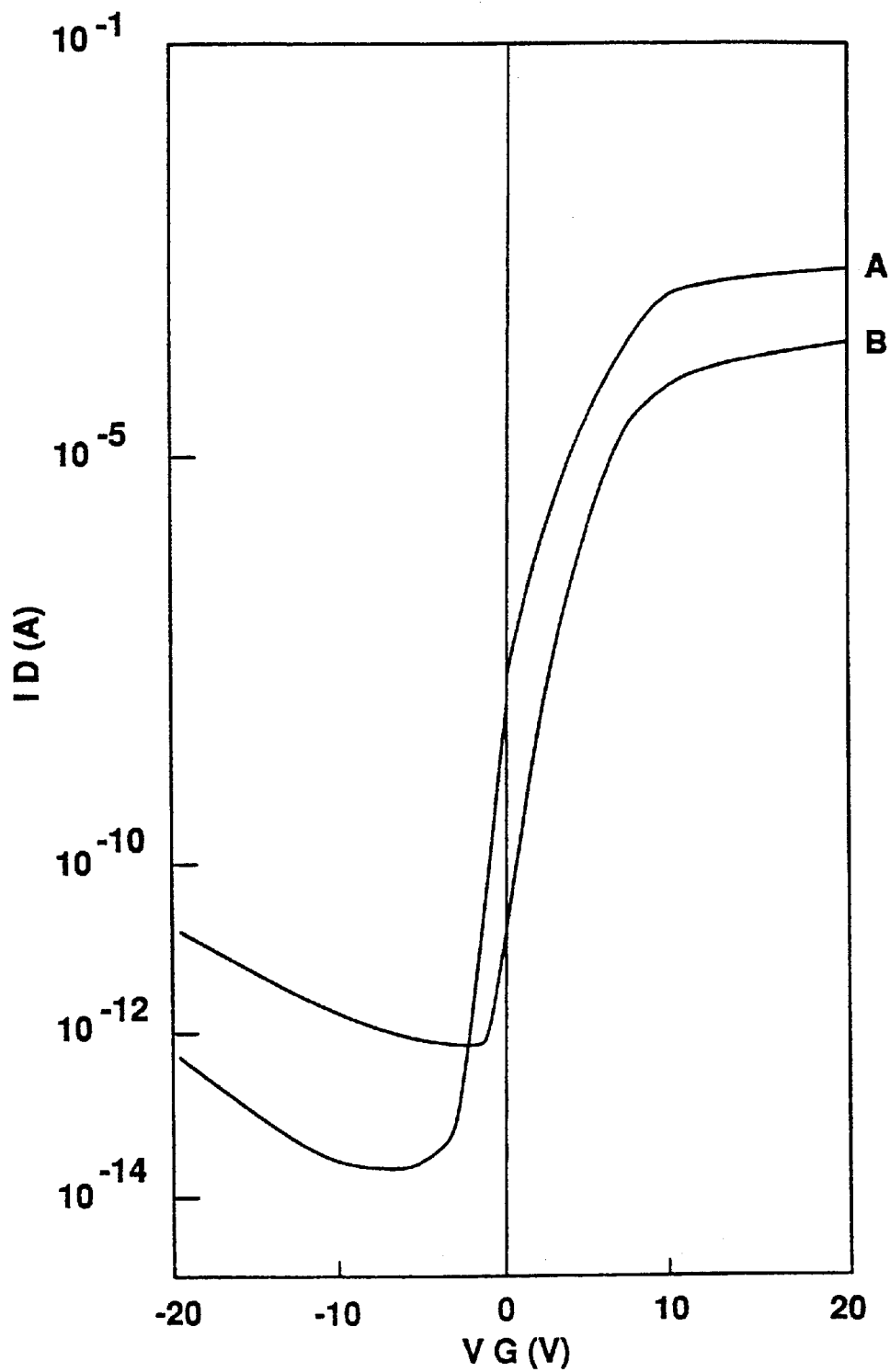
FIG. 17 is a diagram showing the characteristic of TFT.
Figure 18:
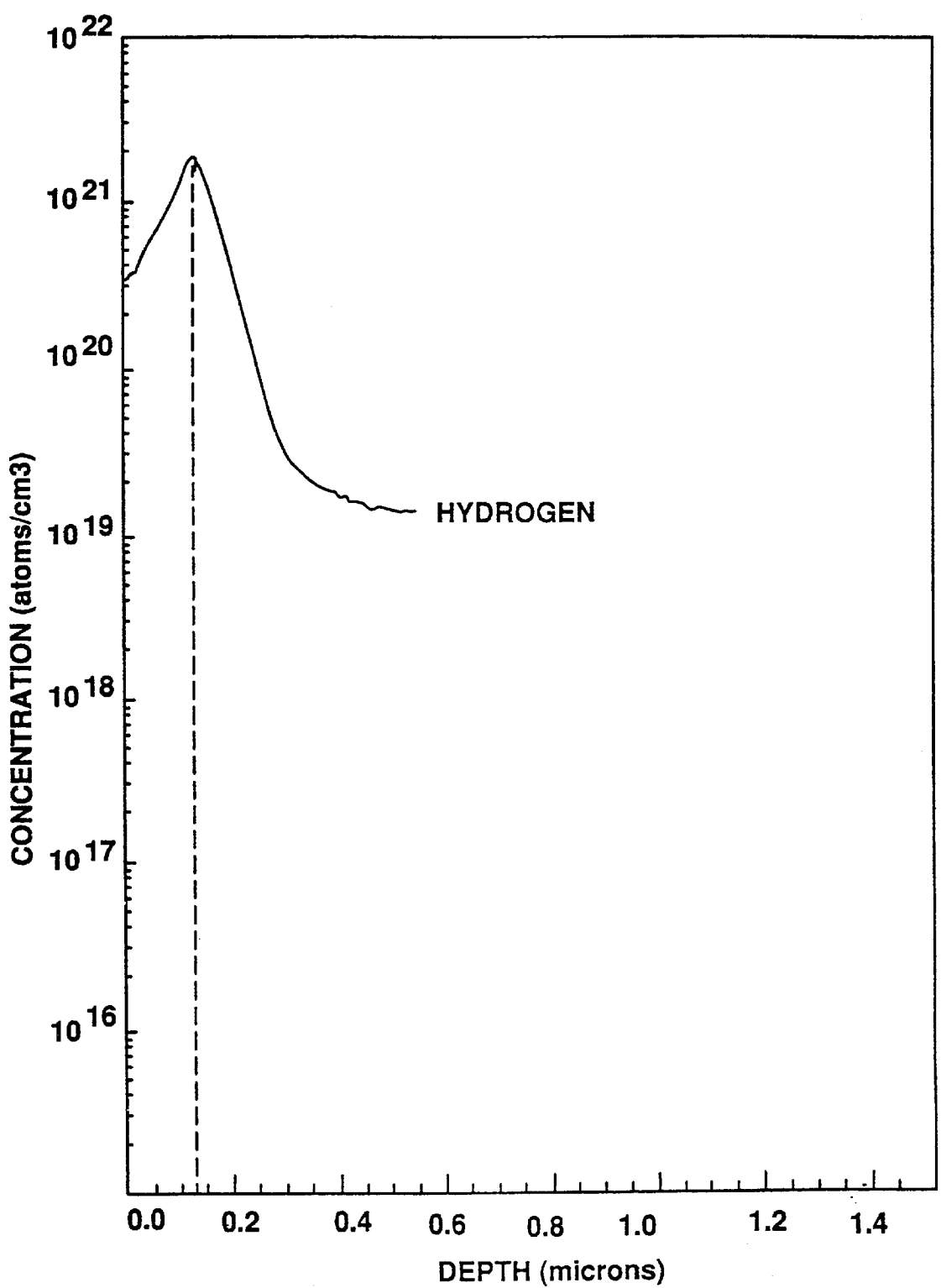
FIGS. 18 and 19 show depth profiles of hydrogen concentration by SIMS.
Figure 19:
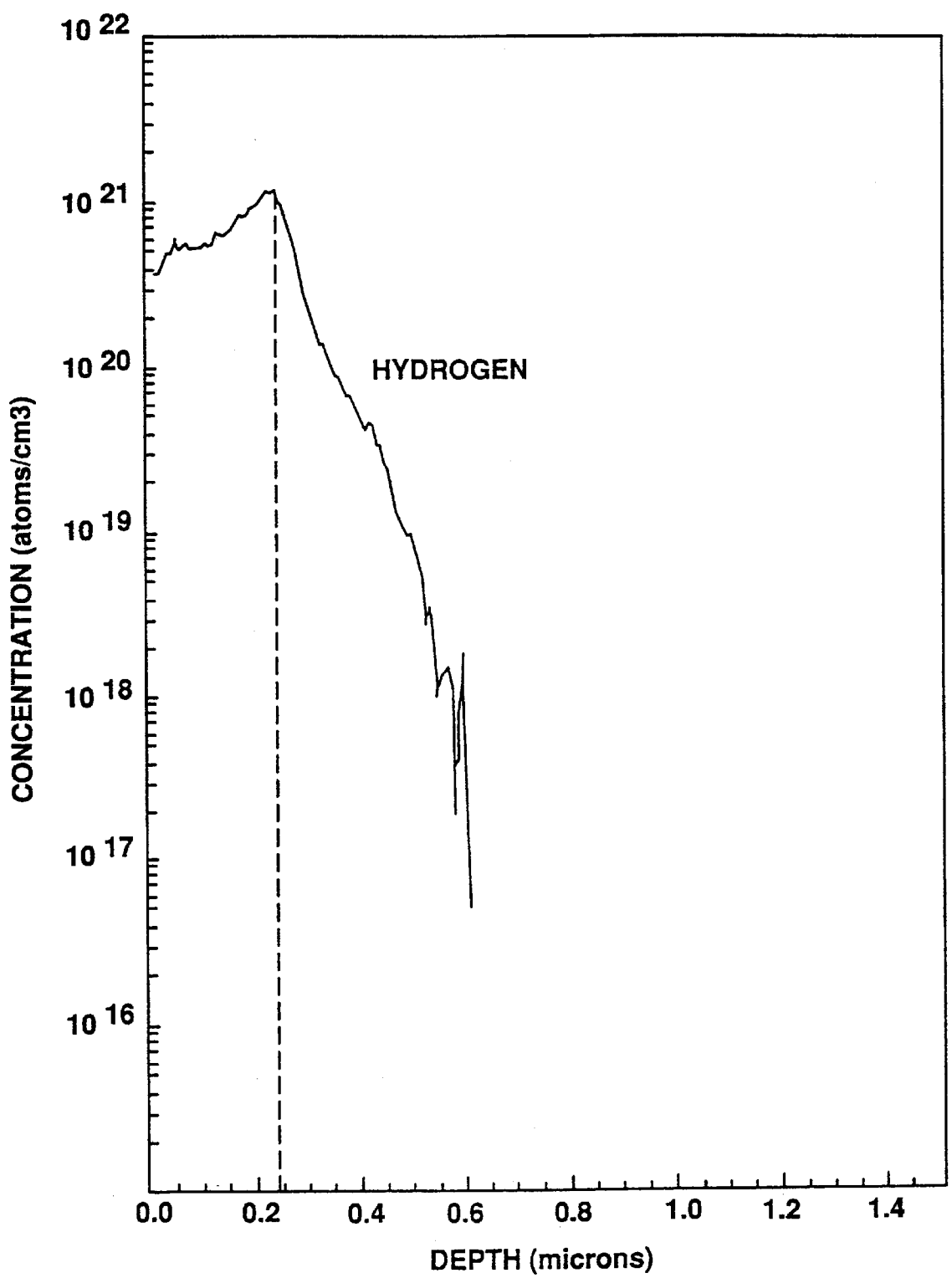

The TFT obtained in this embodiment exhibits the characteristic as indicated by curve A in FIG. 17. The TFT obtained without performing the hydrogen ion implantation, exhibits the characteristic as indicated by curve B in FIG. 17. The TFT has a channel which is 5 µm in length and 5 µm in width and a VD of 1 V. As shown in FIG. 17, the off current is reduced by the implantation of hydrogen ions. The probable reason for this is that hydrogen ions neutralize dangling bonds of silicon in the active layer, thereby reducing defects and levels responsible for leakage current (off current).

Embodiment 9

This embodiment demonstrates the production of TFT by forming the gate electrode, forming a silicon nitride film, introducing impurity ions to form the source and drain regions, and further introducing hydrogen ions.

FIGS. 12A to 12E show the processes of producing TFT in this embodiment. The TFT is formed on a glass substrate (Corning 7059) having an insulating surface.

A silicon oxide film as an underlying layer, 2000 Å thick, (not shown) is formed by sputtering on the glass substrate 111. An amorphous silicon film, 200–1000 Å thick, is formed thereon by plasma CVD or low pressure heat CVD and then crystallized by heating or irradiation with a laser light (or an equivalent intense light) or a combination thereof. The resulting crystalline silicon film is patterned to form the active layer 112 of desired shape. The silicon oxide film 113, 500–5000 Å, for example, 1000 Å thick, as the gate insulating film is formed by sputtering. (FIG. 12A)

Vapor deposition is performed to form a film, 5000 Å thick, which has mainly aluminum. This film is patterned to form the gate electrode 114. The gate electrode 114 is anodized to form the oxide layer 115, 2000 Å thick, around it. The gate electrode may be formed from any other metal material, a semiconductor material, a laminate or mixture thereof. A silicon nitride film 123, 1000 Å thick, is formed from silane and ammonia as raw gas by plasma CVD. (FIG. 12B)

Phosphorus (P) ions are introduced into the regions 116 and 118. Since the oxide layer 115 and silicon nitride film 123 function as masks, the region 110 can be formed as the offset gate region. Phosphorus ion implantation in this embodiment gives N-channel type TFT. Boron ion implantation will give P-channel type TFT. (FIG. 12C)

Annealing by irradiation with a laser light is performed to activate phosphorus ions introduced in FIG. 12C and to recover the damage caused by ion implantation, by using KrF excimer laser with one to several shots at a power density of 100–300 mJ/cm². The effect of laser irradiation will be enhanced by simultaneous heating at about 300° C. In this way the source and drain regions 116 and 118 are formed. Also, the channel forming region 117 is formed by self-alignment. This annealing may be replaced by the above mentioned RTA with infrared ray or heating.

Hydrogen ions are introduced at an acceleration voltage of 40 keV and a dose of $1\times10^{16}$ cm$^{-2}$ to reduce traps and defects in the active layer.

When a silicon oxide film (about 8000 Å thick) as the interlayer insulating film 119 is formed by plasma CVD with TEOS, the heating temperature should be lower than 350° C. so as to prevent the release of hydrogen ions introduced in FIG. 12D.

Patterning is performed to form holes for interconnect. The electrodes 120 and 121 are formed with aluminum or a multilayer film of aluminum and any other metal. A silicon nitride film 122 (as final coating film) is formed. (FIG. 12E)

Annealing for hydrogenation is performed at 200–500° C. for 1 hour in an atmosphere containing hydrogen under normal pressure. Thus the desired TFT is completed. This annealing confines the hydrogen introduced in FIG. 12D in the active layer and reduces dangling bonds and defects in the active layer.

Embodiment 10

This embodiment demonstrates the production of TFT which traps and defects decrease in the interface between the active layer and the gate insulating film and in the vicinity of the interface. FIGS. 13A to 13D show the processes of producing TFT in this embodiment.

Figure 13A:
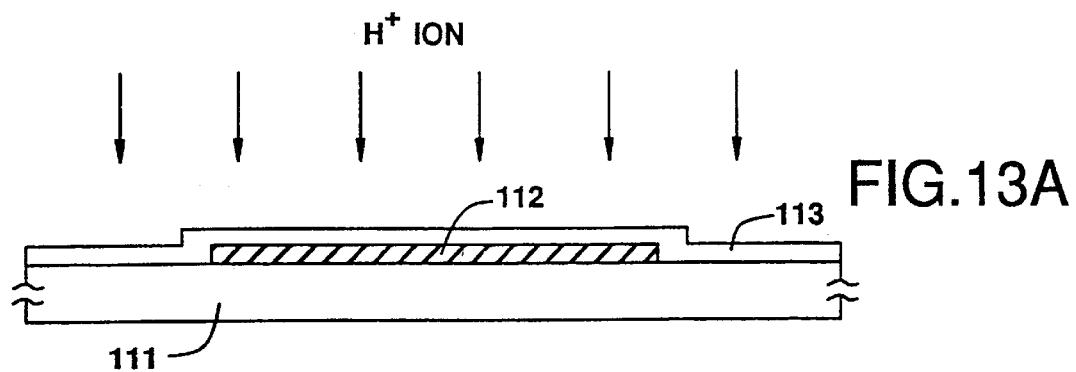
Figure 13B:
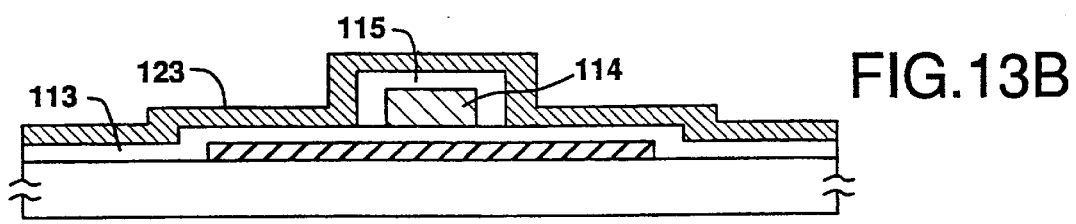

The TFT is formed on a glass substrate (Corning 7059) having a silicon oxide film, 2000 Å thick, as an underlying film formed thereon by sputtering. An amorphous silicon film, 200–1000 Å thick, is formed on the glass substrate 111 by plasma CVD or low pressure heat CVD and then crystallized by heating or irradiation with a laser light (or an equivalent intense light) or a combination thereof. The resulting crystalline silicon film. is patterned to form an active layer 112 of desired shape. The silicon oxide film 113 having a thickness of 500–5000 Å as the gate insulating film is formed by sputtering. Hydrogen ion implantation is then performed at an acceleration voltage of 40 keV and a dose of $1\times10^{16}$ cm$^{-2}$. (FIG. 13A)

This ion implantation reduces traps and defects in the interface between the active layer 112 (especially the channel forming region) and the gate insulating film and in the vicinity of the interface. The effect of this ion implantation is enhanced by setting the projected range for hydrogen ions at the vicinity of the interface between the active layer 112 and the silicon oxide film 113. Thus the effect of hydrogen ion implantation can be produced in the interface between the active layer 112 and the gate insulting film and in the vicinity of the interface.

Vapor deposition is performed to form a film, 5000 Å thick, which has mainly aluminum. This film is patterned to form the gate electrode 114. The gate electrode 114 is anodized to form the oxide layer 115, 2000 Å thick, around it.

Phosphorus (P) ions are introduced into the regions 116 and 118. Since the oxide layer 115 and the silicon nitride film 123 function as a mask, the region 110 can be formed as the offset gate region. (FIG. 13C)

Hydrogen ion implantation is performed at an acceleration voltage of 40 keV and a dose of $2\times10^{16}$ cm$^{-2}$. (FIG. 13D)

Figure 13C:
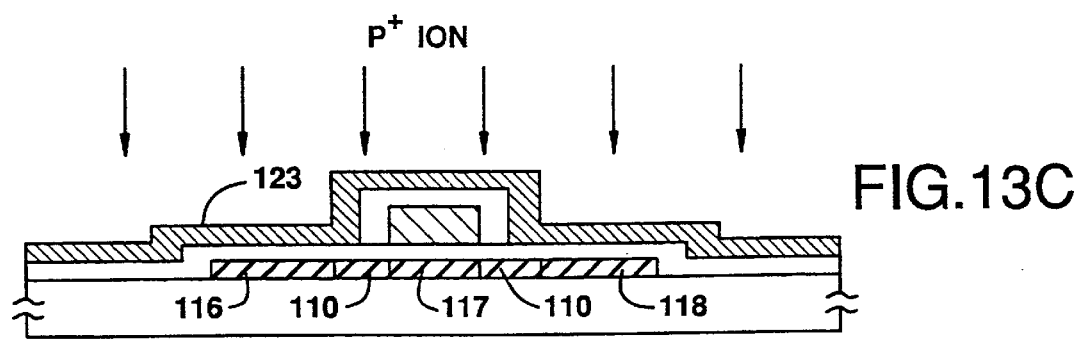
Figure 13D:
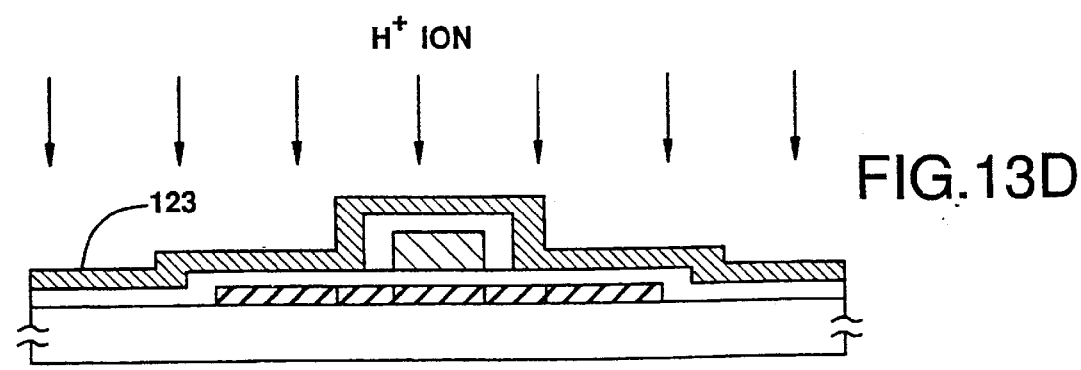

Annealing by irradiation with a laser light is performed to activate phosphorus ions introduced in FIGS. 13C and 13D and to recover the damage caused by phosphorus ion implantation in FIG. 13C, by using KrF excimer laser with one to several shots at a power density of 100–300 mJ/cm². The effect of laser irradiation will be enhanced by simultaneous heating at about 300° C. This annealing may be replaced by the above mentioned RTA with infrared ray or heating.

As in other embodiments, patterning is performed to form an interlayer insulating film and to form holes for interconnect (wiring). Electrodes are formed with aluminum or a multilayer film of aluminum and any other metal. Finally, heat treatment is performed in an atmosphere containing hydrogen under normal pressure. In this way the desired TFT is obtained.

Embodiment 11

This embodiment demonstrates the production of TFT in which hydrogen ion implantation is performed and then a barrier layer (or silicon nitride film) is formed, after the formation of the gate electrode.

Figure 14A:
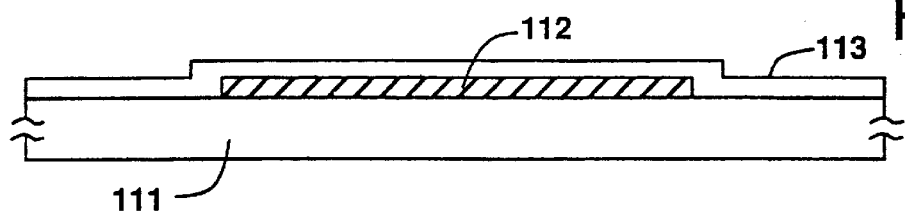

FIGS. 14A to 14D show the processes of producing TFT in this embodiment. The TFT is formed on a glass substrate (Corning 7059) having an insulating surface. A silicon oxide film, 2000 Å thick, as an underlying film is formed by sputtering on the glass substrate 111. An amorphous silicon film (200–1000 Å thick) is formed by plasma CVD or low pressure heat CVD and then crystallized by heating or irradiation with a laser light (or an equivalent intense light) or a combination thereof. The resulting crystalline silicon film is patterned to form an active layer 112 of desired shape. (FIG. 14A)

A silicon oxide film 113, 500–5000 Å, for example, 1000 Å thick, as the gate insulating film is formed by sputtering, and a film, 5000 Å thick, having mainly aluminum is formed by vapor deposition. This film is patterned to form the gate electrode 114. The gate electrode 114 is anodized to form the oxide layer 115, 2000 Å thick, around it. Since the oxide layer 115 on the side of the gate electrode 114 functions as a mask in ion implantation of impurity for providing one conductivity type, the offset gate region can be formed. The gate electrode may be formed from any other metal material, a semiconductor material, a laminate or mixture thereof.

Phosphorus (P) ions are introduced into the regions 116 and 118. Since the oxide layer 115 functions as a mask, the region 110 can be formed as the offset gate region. Phosphorus ion implantation in this embodiment gives N-channel type TFT Boron ion implantation will give, P-channel type TFT. Hydrogen ions are introduced through the silicon nitride film by ion doping at an acceleration voltage of 35 keV and a dose of $1\times10^{16}$ cm$^{-2}$. (FIG. 14B)

The plasma doping is used because of its high productivity. Ion doping can be used in hydrogen ion implantation; however, since it needs mass separation, it is poor in productivity when applied to a large area.

Figure 14B:
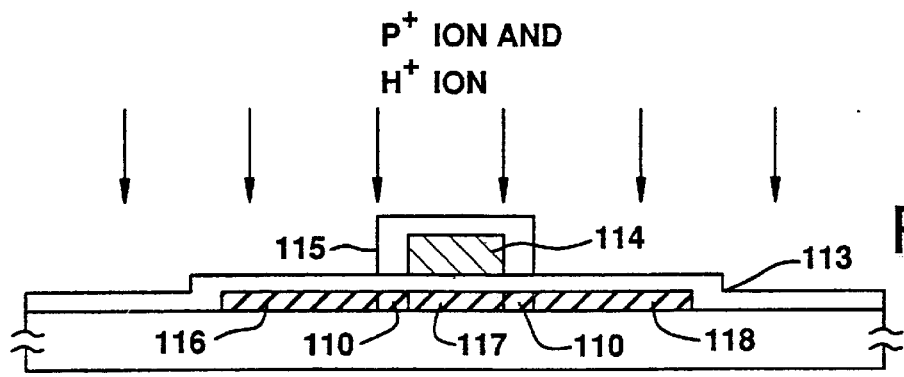

Annealing by irradiation with a laser light is performed to activate phosphorus ions introduced in FIG. 14B, to activate hydrogen ions, and to recover the damage caused by phosphorus ion implantation, by using KrF excimer laser with one to several shots at a power density of 100–300 mJ/cm$^2$. The effect of laser irradiation will be enhanced by simultaneous heating at about 300° C. In this way the source and drain regions 116 and 118 are formed, and the channel forming region 117 is formed at the same time by self-alignment. The introduced hydrogen ions are also activated.

The laser for annealing may be replaced by an equivalent intense light such as infrared ray. With infrared ray which is rarely absorbed by glass but is readily absorbed by silicon, it is possible to selectively heat only silicon. Such heating with infrared ray is called rapid thermal annealing (RTA). Annealing may also be performed by using a heater.

Figure 14C:
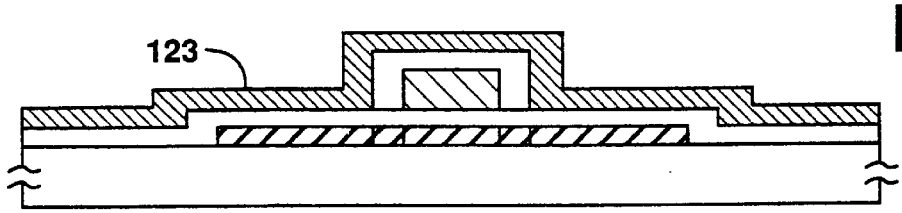

A silicon nitride film 123 ($Si_3N_{4-x}$ ($-0.3 \leq x \leq 1$)), 1000 Å thick, is formed by plasma CVD with silane and ammonia as raw gas. This film functions as a barrier layer to prevent the release of hydrogen ions. That is, the silicon nitride film 123 confines the introduced hydrogen ions in the active layer and prevents them from releasing themselves outside. (FIG. 14C)

When a silicon oxide film (about 8000 Å thick) as the interlayer insulating film 119 is formed by plasma CVD with TEOS, the heating temperature should be lower than 350° C., preferably 300–350° C., so as to prevent the release of hydrogen ions introduced in FIG. 14B. The silicon nitride film 123 prevents the release of hydrogen in this process.

Patterning is performed to form holes for interconnect (wiring). The electrodes 120 and 121 are formed with aluminum or a multilayer film of aluminum and any other metal. A silicon nitride film 122 (as final coating film) 1000–5000 Å thick, for example, 3000 Å thick, is formed by plasma CVD with silane and ammonia as raw gas.

Figure 14D:
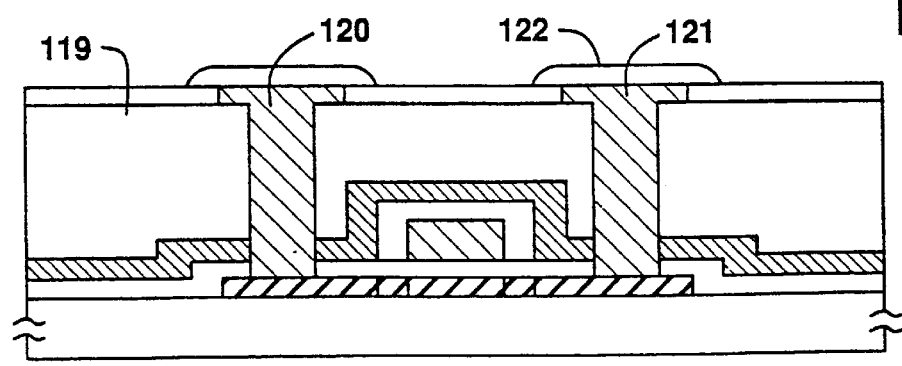

Heat treatment is performed at 200–450° C. in an atmosphere containing oxygen, nitrogen, argon, or helium so as to finally activate the introduced hydrogen ions and to neutralize defects and dangling bonds. Thus the desired TFT is obtained. (FIG. 14D)

Embodiment 12

This embodiment demonstrates complimentary structure TFT (CTFT) having a P-channel type TFT and an N-channel type TFT, as shown in FIG. 15A to 15D. A silicon oxide film 502 (as an underlying film), 2000 Å thick, is formed on a glass substrate 501 by sputtering. An amorphous silicon layer, 200–1000 Å thick, (as a semiconductor layer or active layer) is formed by plasma CVD or LPCVD and then crystallized by heating or irradiation with a laser light or an intense light. The resulting crystalline silicon layer is patterned to form an active layer 503 for N-channel type TFT and P-channel type TFT.

A gate insulating film 504, 500–5000 Å, for example, 1000 Å thick, is formed by sputtering or plasma CVD. A 5000 Å thick coating film having mainly aluminum is formed, and it is patterned to form the gate electrodes 506 and 507. The gate electrode 506 is that of the N-channel type TFT, and the electrode 507 is that of the P-channel type TFT.

The gate electrodes 506 and 607 are anodized in an ethylene glycol solution containing 1–5% tartaric acid, with the gate electrodes being the anode, so that oxide layers 508 and 509, about 2000 Å thick, are formed. The oxide layer functions as a mask in the later process of impurity ion introduction, so that the offset gate region can be formed.

Figure 15A:
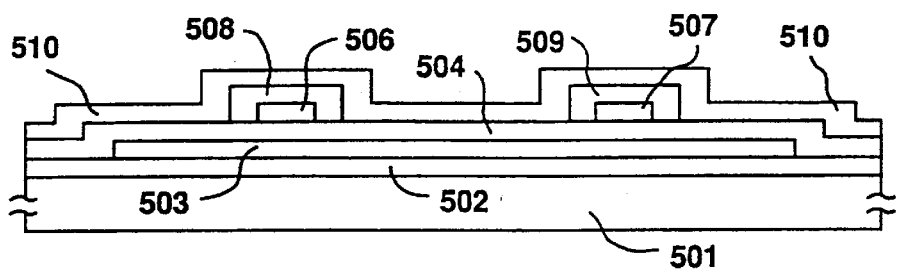

A silicon nitride film 510 (2000 Å thick) which functions as a barrier layer for hydrogen ions is formed. (FIG. 15A)

Figure 15B:
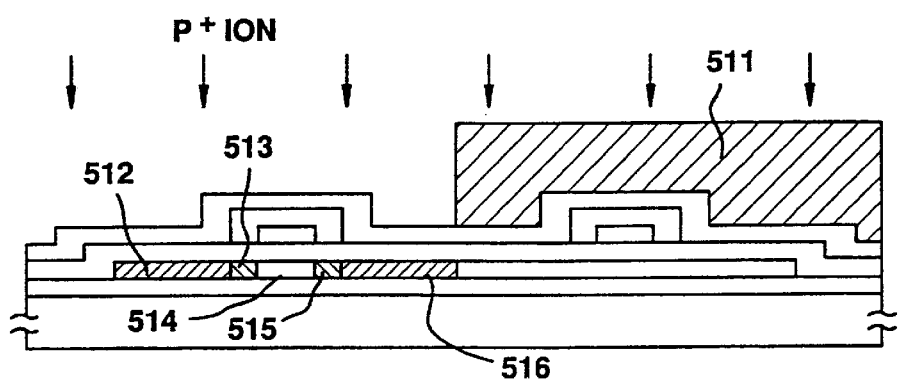

Phosphorus (P) ions are introduced with the region for TFT masked by a resist 511, so that impurity regions 512 and 516 are formed which are the source and drain regions. At the same time, the offset regions 513 and 515 and the channel forming region 514 are formed. (FIG. 15B)

The resist 511 is then removed. The TFT region in which phosphorus ions have been introduced is masked with a resist (not shown), and boron (B) ions are introduced. In this way source and drain regions 517 and 521, offset gate regions 518 and 520, and a channel forming region 519 are formed.

Figure 15C:
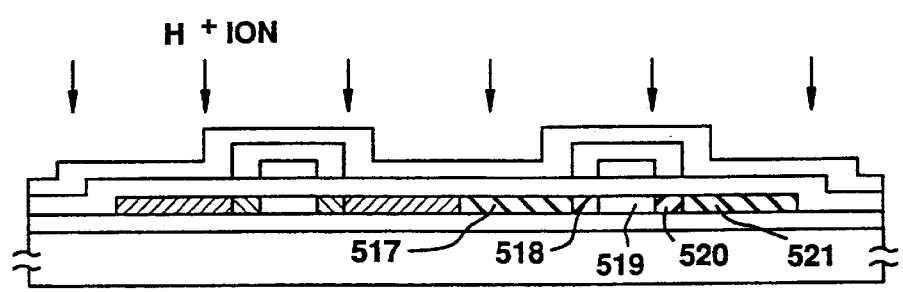

After that, the resist is removed. Hydrogen ion implantation is performed as shown in FIG. 15C, so that hydrogen ions are introduced into the active layer through the silicon nitride film 510. The introduced hydrogen ions are activated by irradiation with a laser light or an intense light. Thus the respective source and drain regions are completed.

Figure 15D:
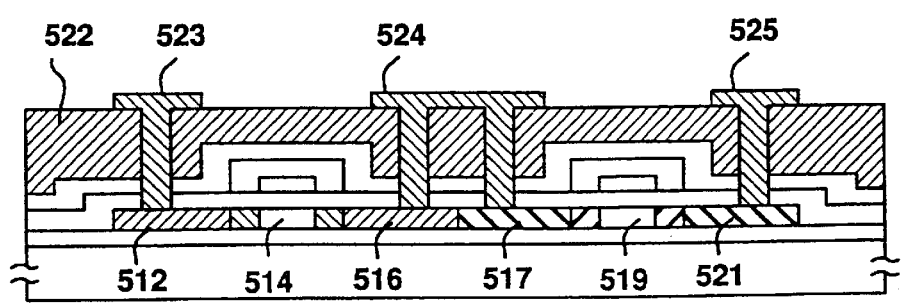
Figure 16:
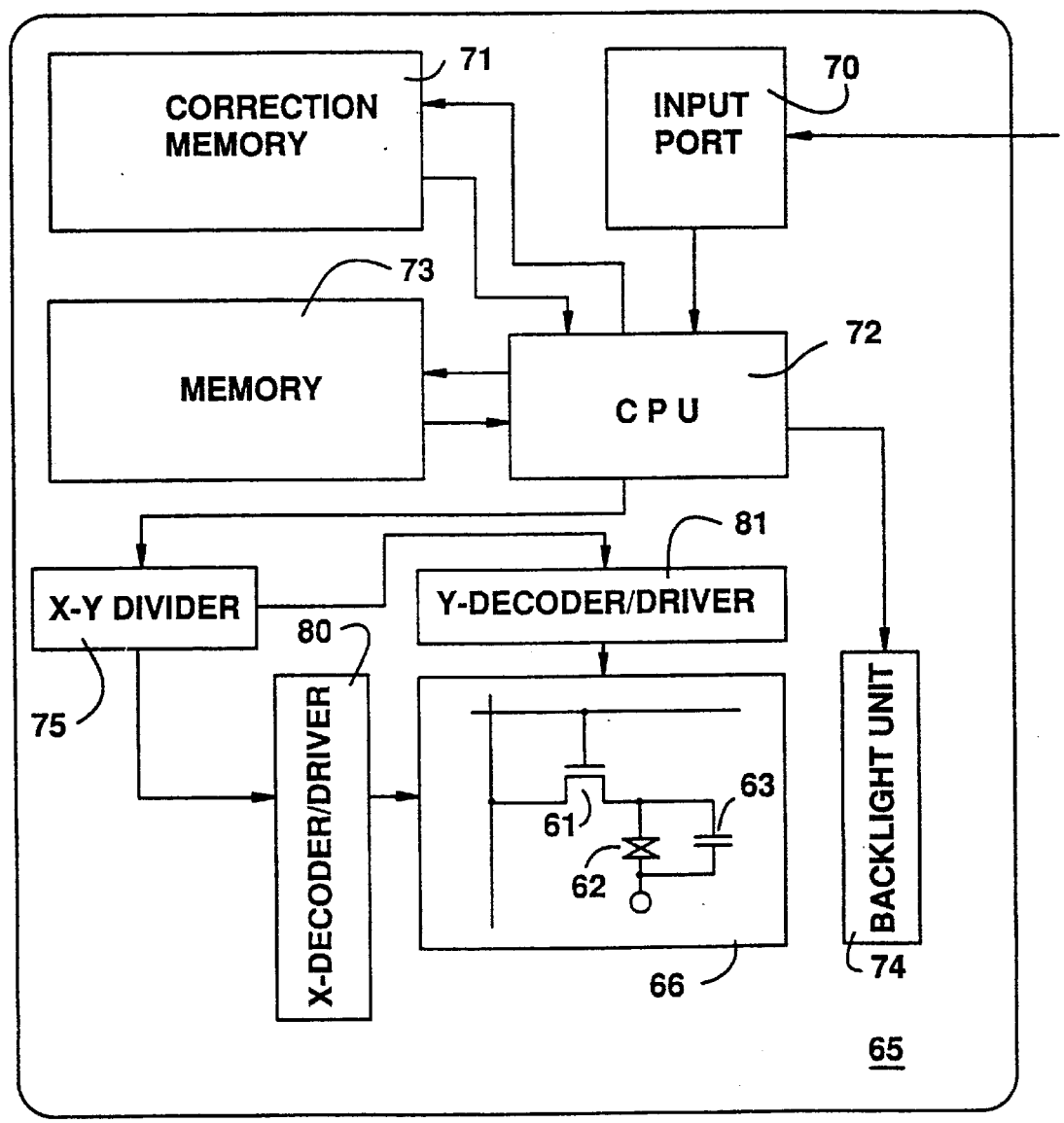
FIG. 16 is a diagram showing the structure of the electro-optical system having TFTs produced in an embodiment.

An interlayer insulating film 522 is formed by plasma CVD, and then contact holes are formed. A source or drain electrode 523 of NTFT which is one TFT (on the left side in the figure) is formed. A drain or source electrode 525 of PTFT which is another TFT (on the right side in the figure) is also formed. The common electrode 524 for the two TFTs is formed. Heat treatment is performed at 200–450° C., for example, 350° C. in an atmosphere containing nitrogen so as to activate the introduced hydrogen ions. Dangling bonds in silicon are neutralized in this process. Thus the complementary structure TFT (CTFT) is completed. (FIG. 15D)

Embodiment 13

This embodiment demonstrates an electro-optical system constructed in an integrated circuit composed of display, CPU, memory, etc. formed on a single glass substrate. FIG.

16 shows the structure of the electro-optical system 65. The system includes an active matrix circuit 66, input port 70, correction memory 71, CPU 72, memory 73, backlight unit 74, X-Y divider 75, X-decoder/driver 80, and Y-decoder/driver 81. The active matrix circuit 66 has TFT 61, liquid crystal 62, and auxiliary capacity 63.

The input port 70 receives input signals, such as image signals from an external unit such as a computer system (not shown). The correction memory 71 is non-volatile memory, which stores data to correct input signals according to the characteristic of the active matrix circuit 66. The correction memory 71 stores information inherent in individual picture elements.

When a defect occurs in the picture element of the active matrix circuit 66 of the electro-optical device 65, such as liquid crystal display (LCD), the CPU 72 reads out corresponding correction data from the correction memory 71 according to the picture elements surrounding the defective picture element and outputs the read out correction data to the Y-decoder/driver 81 through the X-Y divider 75. In this way defects are eliminated. When the defective picture element is darker than its surrounding picture elements, CPU 72 reads out brightness data from the correction memory 71, so that the defective picture element has the same brightness as its surrounding picture elements, and then CPU 72 outputs the read out brightness data to the Y-decoder/driver 81 through the X-Y divider 75.

The CPU 72 and memory 73 are constructed in the same manner as the ordinary computer system. The memory 73 (which is RAM) stores image data corresponding to respective picture elements. The CPU 72 also controls the backlight unit 74 which lights the substrate from its back side according to image information, the substrate being used for the active matrix circuit 66.

The TFT to be used in this embodiment is constructed by the TFT produced in the above mentioned embodiments.

Hydrogen ion implantation into a silicon semiconductor film through a silicon nitride film neutralizes dangling bonds in the silicon semiconductor film and reduces levels in the silicon semiconductor film. The semiconductor film into which the hydrogen ion is introduced provides TFT having good characteristics.

In the embodiments of the present invention, ion implantations of hydrogen, fluoride and chloride are performed from an upper side at a direction vertical to a surface of the substrate. However, an oblique ion implantation which ions are introduced from an oblique direction with respect to the substrate can be performed while the substrate is rotated to uniformly introduce the ions on the whole.

What is claimed is:

1. A method for producing a thin film transistor comprising the steps of:
    forming a semiconductor film comprising silicon and having a thickness of 200 to 1000 Å on an insulating surface;
    crystallizing said semiconductor film;
    forming a first film comprising silicon oxide on said semiconductor film;
    forming a second film on said first film, said second film including one material selected from silicon nitride, aluminum nitride, aluminum oxide, aluminum oxide nitride and silicon oxide nitride;
    introducing hydrogen into said semiconductor film through said first film and said second film by plasma doping; and
    heating said semiconductor film in an atmosphere including hydrogen at 200 to 500° C.

2. A method of claim 1 wherein said crystallizing is performed by one selected from heating, irradiating laser beam, irradiating infrared ray and a combination thereof.

3. A method for producing a thin film transistor comprising the steps of:
    forming a semiconductor film comprising silicon and having a thickness of 200 to 1000 Å on an insulating surface;
    crystallizing said semiconductor film;
    forming an insulating film having a thickness of 500 Å or more to cover said semiconductor film;
    introducing hydrogen into said semiconductor film from an upper surface of said insulating film; and
    heating said semiconductor film at 200 to 500° C.,
    wherein a projected range of the hydrogen is an interface between said semiconductor film and said insulating film.

4. A method of claim 3 wherein said crystallizing is performed by one selected from heating, irradiating laser beam, irradiating infrared ray and a combination thereof.

5. A method of claim 3 wherein said heating is performed in an atmosphere including hydrogen.

6. A method of claim 3 wherein said insulating film includes silicon oxide and the thickness of said insulating film is 500 to 5000 Å.

7. A method of claim 3 wherein the projected range of said hydrogen is slightly shifted toward said semiconductor film from an interface between said semiconductor film and said insulating film.

8. A method for producing a thin film transistors comprising the steps of:
    forming a semiconductor film comprising silicon and having a thickness of 200 to 1000 Å on an insulating surface;
    crystallizing said semiconductor film;
    introducing into said semiconductor film an impurity for providing one conductivity type, using a gate electrode as a mask, to form source and drain regions;
    introducing hydrogen into said source and drain regions by plasma doping;
    forming a barrier layer over said semiconductor film, said barrier layer including one material selected from silicon nitride, aluminum nitride, aluminum oxide, aluminum oxide nitride and silicon oxide nitride; and
    heating said semiconductor film at 200 to 500° C.

9. A method of claim 8 wherein said crystallizing is performed by one selected from heating, irradiating laser beam, irradiating infrared ray and a combination thereof.

10. A method for producing a thin film transistor comprising the steps of:
    forming a semiconductor film comprising silicon and having a thickness 200 to 1000 Å on an insulating surface;
    crystallizing said semiconductor film;
    introducing into said semiconductor film an impurity for providing one conductivity type, using a gate electrode as a mask, to form source and drain regions;
    introducing hydrogen into said source and drain regions by plasma doping;
    annealing said semiconductor film; and
    heating at least said semiconductor film in an atmosphere including hydrogen.

11. A method of claim 10 wherein said crystallizing and said annealing are performed by one selected from heating, irradiating laser beam, irradiating infrared ray and a combination thereof.

12. A method of claim 10 wherein said heating is performed at 200 to 500° C.

13. A method for producing a thin film transistor comprising the steps of:
    forming a semiconductor film comprising silicon and having a thickness of 200 to 1000 Å on an insulating surface;
    crystallizing said semiconductor film;
    forming an insulating film having a thickness of 500 Å or more on said semiconductor film;
    introducing hydrogen into said semiconductor film through said insulating film by plasma doping; and
    heating the semiconductor film and the insulating film in an atmosphere including hydrogen at 200 to 500° C.,
    wherein an interface level between said insulating film and said semiconductor film is lowered, and
    wherein a projected range of said hydrogen is an interface between said semiconductor film and said insulating film.

14. A method of claim 13 wherein said crystallizing is performed by one selected from heating, irradiating laser beam, irradiating infrared ray and a combination thereof.

15. A method of claim 13 wherein said projected range is slightly shifted toward said semiconductor film from an interface between said semiconductor film and said insulating film.

16. A method of claim 13 wherein said insulating film includes silicon oxide and the thickness of said insulating film is 500 to 5000 Å.

17. A method for producing a thin film transistor comprising the steps of:
    forming a semiconductor film comprising silicon and having a thickness of 200 to 1000 Å on an insulating surface;
    crystallizing said semiconductor film;
    forming a gate electrode adjacent to said semiconductor film with an insulating film interposed therebetween, said insulating film having a thickness of 500 Å or more;
    forming a film comprising silicon nitride over said insulating film and said gate electrode;
    introducing hydrogen into said semiconductor film through said film comprising silicon nitride by plasma doping, and
    heating at least said semiconductor film at 200 to 500° C. after said introducing step.

18. A method of claim 17 wherein said insulating film includes silicon oxide and the thickness of said insulating film is 500 to 5000 Å.

19. A method of claim 17 wherein said crystallizing is performed by one selected from heating, irradiating laser beam, irradiating infrared ray and a combination thereof.

20. A method for producing a thin film transistor comprising the steps of:
    forming a semiconductor film comprising silicon and having a thickness of 200 to 1000 Å on an insulating surface;
    crystallizing said semiconductor film;
    forming a gate electrode adjacent to said semiconductor film with an insulating film interposed therebetween, said insulating film having a thickness of 500 Å or more;
    forming a barrier layer over said insulating film and said gate electrode;
    introducing hydrogen into said semiconductor film through said barrier layer by plasma doping, and
    heating at least said semiconductor film in an atmosphere including hydrogen at 200 to 500° C.

21. A method of claim 20 wherein said crystallizing is performed by one selected from heating, irradiating laser beam, irradiating infrared ray and a combination thereof.

22. A method of claim 20 wherein said barrier layer confines said hydrogen in said semiconductor film.

23. A method of claim 20 wherein said barrier layer includes one material selected from silicon nitride, aluminum nitride, aluminum oxide, aluminum oxide nitride and silicon oxide nitride.

24. A method of claim 20 wherein said insulating film includes silicon oxide and the thickness of said insulating film is 500 to 5000 Å.

25. A method for producing a thin film transistor comprising the steps of:
    forming a semiconductor film comprising silicon and having a thickness of 200 to 1000 Å on an insulating surface;
    crystallizing said semiconductor film;
    forming a gate electrode adjacent to said semiconductor film with an insulating film interposed therebetween;
    introducing into said semiconductor film an impurity for providing one conductivity type to form source and drain regions;
    annealing at least said semiconductor film;
    forming a barrier layer over said insulating film and said gate electrode;
    introducing hydrogen into said semiconductor film through said barrier layer by plasma doping; and
    heating at least said semiconductor film at 200 to 500° C.

26. A method of claim 25 wherein said crystallizing and said annealing are performed by one method selected from heating, irradiating laser beam, irradiating infrared ray and a combination thereof.

27. A method of claim 25 wherein said barrier layer confines said hydrogen in said semiconductor film.

28. A method of claim 25 wherein said barrier layer includes one material selected from silicon nitride, aluminum nitride, aluminum oxide, aluminum oxide nitride and silicon oxide nitride.

29. A method of claim 25 wherein said insulating film includes silicon oxide and a thickness of said insulating film is 500 to 5000 Å.

30. A method for producing a thin film transistor comprising the steps of:
    forming a semiconductor film comprising silicon on an insulating surface;
    crystallizing said semiconductor film;
    forming a gate electrode adjacent to said semiconductor film with an insulating film interposed therebetween;
    forming a barrier layer over said insulating film and said gate electrode;
    introducing into said semiconductor film an impurity for providing one conductivity type through said barrier layer to form source and drain regions;
    introducing hydrogen into said semiconductor film through said barrier layer by plasma doping;
    annealing at least said semiconductor.

31. A method of claim 30 wherein said crystallizing and said annealing are performed by one method selected from heating, irradiating laser beam, irradiating infrared ray and a combination thereof.

32. A method of claim 30 wherein said barrier layer confines said hydrogen in said semiconductor film.

33. A method of claim 30 wherein said barrier layer includes one material selected from silicon nitride, aluminum nitride, aluminum oxide, aluminum oxide nitride and silicon oxide nitride.

34. A method of claim 30 wherein said insulating film includes silicon oxide and a thickness of said insulating film is 500 to 5000 Å.

35. A method for producing a thin film transistor comprising the steps of:

forming a semiconductor film comprising silicon and having a thickness of 200 to 1000 Å on an insulating surface;

crystallizing said semiconductor film;

forming an insulating film to cover said semiconductor film;

introducing hydrogen into said semiconductor film through said insulating film by plasma doping;

introducing into said semiconductor film an impurity for providing one conductivity type, using a gate electrode as a mask, to form source and drain regions;

annealing at least said semiconductor film; and heating at least said semiconductor film at 200 to 500° C.

36. A method of claim 35 wherein said crystallizing and said annealing are performed by one method selected from heating, irradiating laser beam, irradiating infrared ray and a combination thereof.

37. A method of claim 35 wherein said barrier layer confines said hydrogen in said semiconductor film.

38. A method of claim 35 wherein said barrier layer includes one material selected from silicon nitride, aluminum nitride, aluminum oxide, aluminum oxide nitride and silicon oxide nitride.

39. A method of claim 35 wherein said insulating film includes silicon oxide and a thickness of said insulating film is 500 to 5000 Å.

40. A method for producing a thin film transistor comprising the steps of:

forming a semiconductor film comprising silicon on an insulating surface;

crystallizing said semiconductor film;

forming an insulating film on said semiconductor film;

forming a gate electrode adjacent to said semiconductor film with an insulating film interposed therebetween;

introducing hydrogen into said semiconductor film through said insulating film by plasma doping, and heating at least said semiconductor film in an atmosphere including hydrogen.

41. A method of claim 40 wherein said crystallizing is performed by one selected from heating, irradiating laser beam, irradiating infrared ray and a combination thereof.

42. A method of claim 40 wherein said insulating film includes silicon oxide and the thickness of said insulating film is 500 to 5000 Å.

43. A method according to claim 1 wherein a hydrogen gas is used as a doping gas during introducing hydrogen into said semiconductor film by said plasma doping.

44. A method according to claim 3 wherein a hydrogen gas is used as a doping gas during introducing hydrogen into said semiconductor film by said plasma doping.

45. A method according to claim 8 wherein a hydrogen gas is used as a doping gas during introducing hydrogen into said source and drain regions by said plasma doping.

46. A method according to claim 10 wherein a hydrogen gas is used as a doping gas during introducing hydrogen into said source and drain regions by said plasma doping.

47. A method according to claim 13 wherein a hydrogen gas is used as a doping gas during introducing hydrogen into said semiconductor film by said plasma doping.

48. A method according to claim 17 wherein a hydrogen gas is used as a doping gas during introducing hydrogen into said semiconductor film by said plasma doping.

49. A method according to claim 20 wherein a hydrogen gas is used as a doping gas during introducing hydrogen into said semiconductor film by said plasma doping.

50. A method according to claim 25 wherein a hydrogen gas is used as a doping gas during introducing hydrogen into said semiconductor film by said plasma doping.

51. A method according to claim 30 wherein a hydrogen gas is used as a doping gas during introducing hydrogen into said semiconductor film by said plasma doping.

52. A method according to claim 35 wherein a hydrogen gas is used as a doping gas during introducing hydrogen into said semiconductor film by said plasma doping.

53. A method according to claim 40 wherein a hydrogen gas is used as a doping gas during introducing hydrogen into said semiconductor film by said plasma doping.

* * * * *